United States Patent
Lee et al.

(10) Patent No.: US 12,176,313 B2
(45) Date of Patent: Dec. 24, 2024

(54) SEMICONDUCTOR PACKAGE

(71) Applicant: SAMSUNG ELECTRONICS CO., LTD., Suwon-si (KR)

(72) Inventors: Hyoungjoo Lee, Hwaseong-si (KR); Unbyoung Kang, Hwaseong-si (KR); Sechul Park, Bucheon-si (KR); Sangsick Park, Hwaseong-si (KR); Hyojin Yun, Suwon-si (KR); Teakhoon Lee, Hwaseong-si (KR); Juil Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 17/652,782

(22) Filed: Feb. 28, 2022

(65) Prior Publication Data
US 2023/0011778 A1    Jan. 12, 2023

(30) Foreign Application Priority Data

Jul. 12, 2021 (KR) .......................... 10-2021-0090895

(51) Int. Cl.
*H01L 23/00*      (2006.01)
*H01L 25/065*     (2023.01)

(52) U.S. Cl.
CPC .......... *H01L 24/16* (2013.01); *H01L 25/0657* (2013.01); *H01L 2224/10125* (2013.01); *H01L 2224/10145* (2013.01); *H01L 2224/16148* (2013.01)

(58) Field of Classification Search
None
See application file for complete search history.

(56) References Cited

U.S. PATENT DOCUMENTS

| 9,171,813 | B2 | 10/2015 | Yang |
| 9,497,861 | B2 | 11/2016 | Lu et al. |
| 10,020,236 | B2 | 7/2018 | Wang et al. |
| 10,340,200 | B2 | 7/2019 | Miki |
| 10,798,976 | B2 | 10/2020 | Pan et al. |

(Continued)

FOREIGN PATENT DOCUMENTS

| CN | 212676261 | 3/2021 |
| KR | 10-2019-0136459 | 12/2019 |

*Primary Examiner* — Hung K Vu
(74) *Attorney, Agent, or Firm* — F. CHAU & ASSOCIATES, LLC

(57) ABSTRACT

A semiconductor package includes: a first semiconductor chip; a second semiconductor chip stacked on the first semiconductor chip; an underfill material layer interposed between the first semiconductor chip and the second semiconductor chip; and a first dam structure disposed on the first semiconductor chip. The first dam structure extends along an edge of the second semiconductor chip and includes unit dam structures apart from each other with a slit therebetween. A vertical level of an upper surface of the first dam structure is located between a vertical level of a lower surface of the second semiconductor chip and a vertical level of an upper surface of the second semiconductor chip. A first sidewall of the first dam structure is in contact with the underfill material layer and includes a flat surface parallel to a sidewall of the second semiconductor chip that faces the first sidewall of the first dam structure.

14 Claims, 24 Drawing Sheets

(56) References Cited

U.S. PATENT DOCUMENTS

| | | | |
|---|---|---|---|
| 2010/0078791 A1* | 4/2010 | Yim | H01L 25/105 |
| | | | 257/E23.129 |
| 2018/0342466 A1* | 11/2018 | Lin | H01L 21/56 |
| 2020/0312770 A1 | 10/2020 | Lu et al. | |
| 2020/0350288 A1* | 11/2020 | Park | H01L 25/0657 |
| 2021/0082891 A1 | 3/2021 | Cha et al. | |
| 2021/0111160 A1 | 4/2021 | Kim | |

* cited by examiner

SEMICONDUCTOR PACKAGE

CROSS-REFERENCE TO RELATED APPLICATION

This application claims priority under 35 U.S.C. § 119 from Korean Patent Application No. 10-2021-0090895, filed on Jul. 12, 2021 in the Korean Intellectual Property Office, the contents of which are herein incorporated by reference in their entirety.

TECHNICAL FIELD

Embodiments of the inventive concept are directed to a semiconductor package, and more particularly, to a semiconductor package that includes an underfill material layer.

DISCUSSION OF THE RELATED ART

Due to the demand for portable electronic devices, there is a continuous need for miniaturization and weight reduction of electronic components mounted on these products, such as semiconductor chips. To miniaturize and reduce the weight of electronic components, a semiconductor package technology that integrates a plurality of semiconductor chips that constitute components into a single package would be useful, as well as a technology that reduces the individual sizes of components to be mounted thereon.

SUMMARY

Embodiments of the inventive concept provide a semiconductor package that includes an underfill material layer for stacking semiconductor chips.

According to an embodiment of the inventive concept, there is provided a semiconductor package that includes: a first semiconductor chip; a second semiconductor chip stacked on the first semiconductor chip; an underfill material layer interposed between the first semiconductor chip and the second semiconductor chip; and a first dam structure disposed on the first semiconductor chip. The first dam structure extends along an edge of the second semiconductor chip and includes unit dam structures apart from each other with a slit therebetween. A vertical level of an upper surface of the first dam structure is located between a vertical level of a lower surface of the second semiconductor chip and a vertical level of an upper surface of the second semiconductor chip. The unit dam structures of the first dam structure each have a rectangular shape in a plan view, and a first sidewall of the first dam structure is in contact with the underfill material layer and includes a flat surface parallel to a sidewall of the second semiconductor chip that faces the first sidewall of the first dam structure.

According to another embodiment of the inventive concept, there is provided a semiconductor package that includes: a first semiconductor chip; a second semiconductor chip stacked on an upper surface of the first semiconductor chip; and an underfill material layer interposed between the first semiconductor chip and the second semiconductor chip, where the underfill material layer covers at least a portion of a sidewall of the second semiconductor chip and includes a lower sidewall that extends linearly in a direction perpendicular to the upper surface of the first semiconductor chip and a curvilinear upper sidewall connected to the lower sidewall. The curvilinear upper sidewall of the underfill material layer defines a indentation in an outer region of the underfill material layer.

According to another embodiment of the inventive concept, there is provided a semiconductor package that includes: a first semiconductor chip that includes a first semiconductor substrate, a first semiconductor device layer disposed on the first substrate and that includes a first interconnect structure, and a first through electrode that penetrates through the first semiconductor substrate and is electrically connected to the first interconnect structure; a second semiconductor chip disposed on the first semiconductor chip, where the second semiconductor chip includes a second semiconductor substrate, a second semiconductor device layer disposed on the second substrate and that includes a second interconnect structure, and a second through electrode that penetrates through the second semiconductor substrate and is electrically connected to the second interconnect structure; a connection bump interposed between the first semiconductor chip and the second semiconductor chip; an underfill material layer interposed between the first semiconductor chip and the second semiconductor chip, where the underfill material layer surrounds a sidewall of the connection bump and covers at least a portion of a sidewall of the second semiconductor chip; a first dam structure disposed on the first semiconductor chip, where the first dam structure comes in contact with the underfill material layer, extends along an edge of the second semiconductor chip, and includes a plurality of slits and a plurality of unit dam structures apart from each other by the plurality of slits; and a molding layer disposed on the first semiconductor chip and that covers the underfill material layer and the first dam structure. The first dam structure further includes: a first sidewall in contact with the underfill material layer and that includes a flat surface parallel to the sidewall of the second semiconductor chip; and an upper surface located between a vertical level of a lower surface of the second semiconductor chip and a vertical level of an upper surface of the second semiconductor chip. An interval between unit dam structures adjacent in a first direction parallel to the edge of the second semiconductor chip is about 100% or less of a horizontal length of each of the plurality of unit dam structures in the first direction.

According to another embodiment of the inventive concept, there is provided a method of manufacturing a semiconductor package. The method includes providing a semiconductor wafer that includes a plurality of first semiconductor chips that are separated from each other; forming first dam structures on the semiconductor wafer, wherein the first dam structures extend along an imaginary rectangular line on the semiconductor wafer, and define chip mounting regions surrounded by the first dam structures; mounting second semiconductor chips on the semiconductor wafer in the chip mounting regions defined by the first dam structure, wherein an underfill material is attached to the second semiconductor chips and is interposed between the semiconductor wafer and the second semiconductor chips; interposing a bonding foil between a bonding head and a first second semiconductor chip on a first chip mounting region of the semiconductor wafer; applying heat and pressure to the first second semiconductor chip by using the bonding head, wherein the underfill material changes to a liquid and flows in a peripheral direction of the first second semiconductor chip, and wherein the first dam structure blocks the flow of the liquid underfill material; curing the liquid underfill material to form a first underfill material layer in the first chip mounting region; interposing the bonding foil between the bonding head and a second second semiconductor chip on a second chip mounting region of the semiconductor wafer; applying heat and pressure to the second second semiconductor chip by using the bonding head, wherein the underfill material changes to a liquid and flows in a peripheral direction of the first second semiconductor chip, and wherein the liquid underfill material is prevented from overflowing beyond the first dam structure and toward the first second semiconductor chip; and curing the liquid underfill material to form a first underfill material layer in the second chip mounting region.

DETAILED DESCRIPTION

Figure 1A:
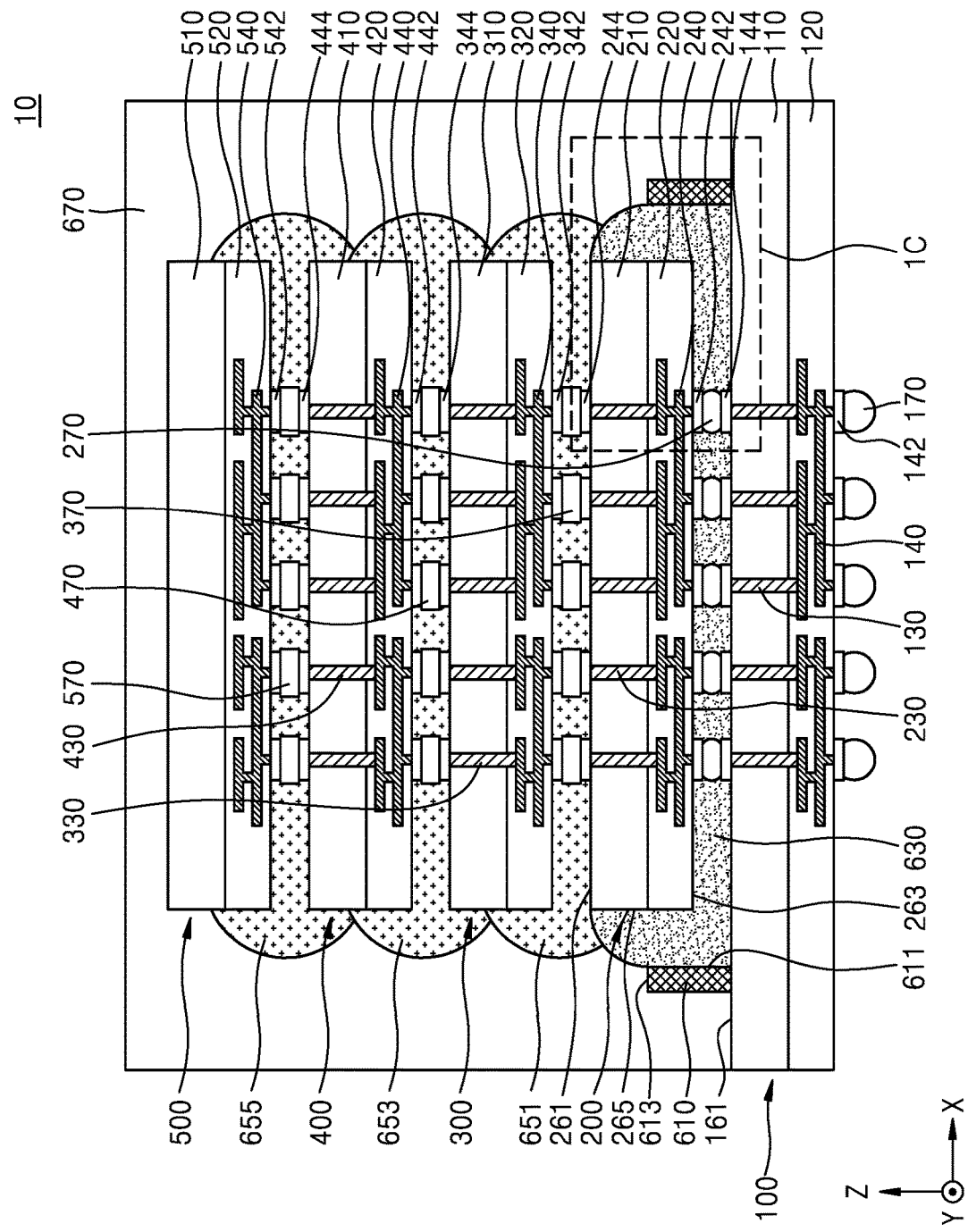
FIG. 1A is a cross-sectional view of a semiconductor package according to exemplary embodiments of the inventive concept.

Exemplary embodiments of the inventive concept will be described in detail with reference to the accompanying drawings. The same reference numerals may be assigned to refer to the same elements in the drawings, and redundant descriptions thereof may be omitted.

The term "about" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 1B:
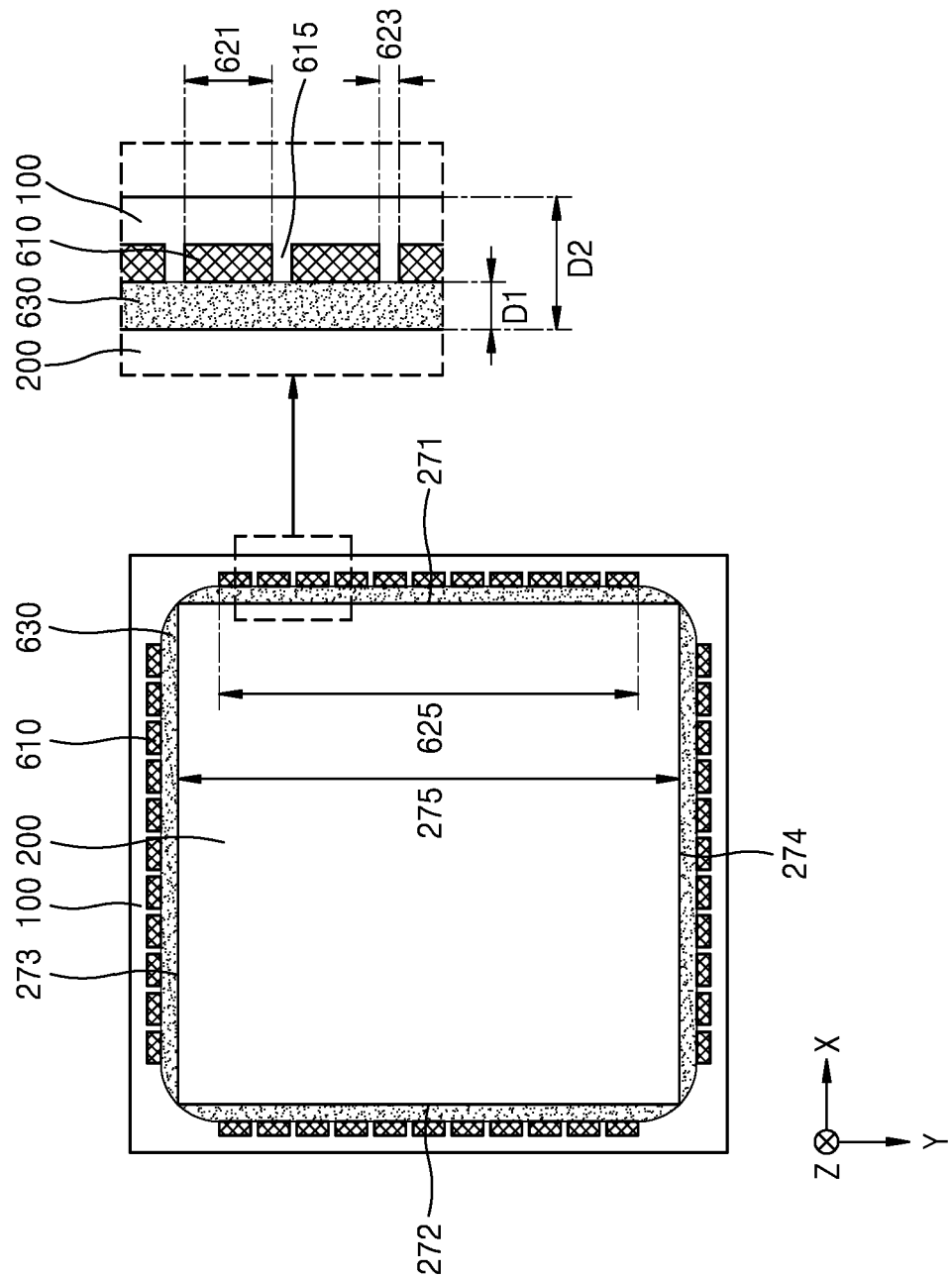
FIG. 1B is a plan view of a semiconductor package of FIG. 1A.
Figure 1C:
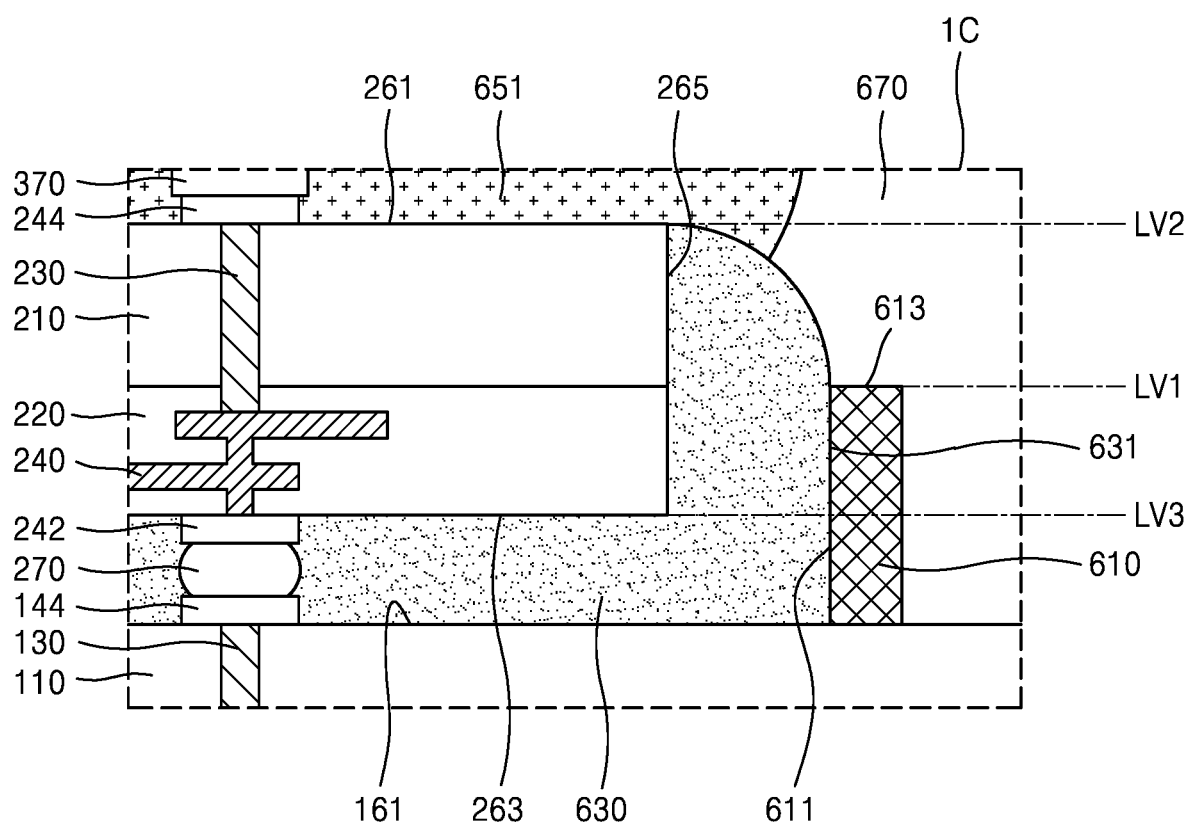
FIG. 1C is an enlarged view of a portion "1C" in FIG. 1A.

FIG. 1A is a cross-sectional view of a semiconductor package 10 according to exemplary embodiments of the inventive concept. FIG. 1B is a plan view of the semiconductor package 10 of FIG. 1A. FIG. 1C is an enlarged view of a portion "1C" in FIG. 1A.

Referring to FIGS. 1A to 1C, in an embodiment, the semiconductor package 10 includes a first semiconductor chip 100, a second semiconductor chip 200 stacked on an upper surface 161 of the first semiconductor chip 100, a third semiconductor chip 300, a fourth semiconductor chip 400, and a fifth semiconductor chip 500. The second to fifth semiconductor chips 200, 300, 400, and 500 are vertically stacked on the first semiconductor chip 100. The planar area of the first semiconductor chip 100 is greater than the planar area of the second semiconductor chip 200, and the planar areas of the third to fifth semiconductor chips 300, 400, and 500 are substantially equal to the planar area of the second semiconductor chip 200.

Hereinafter, a direction parallel to the upper surface 161 of the first semiconductor chip 100 is referred to as a horizontal direction, such as an X direction and/or a Y direction, and a direction perpendicular to the upper surface 161 of the first semiconductor chip 100 is referred to as a vertical direction, such as a Z direction. In addition, a horizontal distance or a horizontal width refers to a length in a horizontal direction, such as the X direction and/or the Y direction, and a vertical level refers to a level in the vertical direction, such as the Z direction.

The first to fifth semiconductor chips 100, 200, 300, 400, and 500 are electrically connected to each other through second to fifth connection bumps 270, 370, 470, and 570, or are electrically connected to the first semiconductor chip 100. In addition, the first to fifth semiconductor chips 100, 200, 300, 400, and 500 are attached to each other by an underfill material layer.

In a present embodiment, an underfill material layer between the first semiconductor chip 100 and the second semiconductor chip 200 is referred to as a first underfill material layer 630, an underfill material layer between the second semiconductor chip 200 and the third semiconductor chip 300 is referred to as a second underfill material layer 651, an underfill material layer between the third semiconductor chip 300 and the fourth semiconductor chip 400 is referred to as a third underfill material layer 653, and an underfill material layer between the fourth semiconductor chip 400 and the fifth semiconductor chip 500 is referred to as a fourth underfill material layer 655. The first to fourth underfill material layers 630, 651, 653, and 655 include the same material. The first to fourth underfill material layers 630, 651, 653, and 655 include, for example, a non-conductive film (NCF). The underfill material layers will be described in detail below.

The first to fifth semiconductor chips 100, 200, 300, 400, and 500 may be logic chips or memory chips. For example, all of the first to fifth semiconductor chips 100, 200, 300, 400, and 500 may be memory chips. Alternatively, some of the first to fifth semiconductor chips 100, 200, 300, 400, and 500 may be memory chips, and other semiconductor chips may be logic chips.

The memory chip may be, for example, a volatile memory chip, such as a dynamic random access memory (DRAM) or a static random access memory (SRAM), or a non-volatile memory chip such as a phase-change RAM (PRAM), a magnetoresistive RAM (MRAM), a ferroelectric RAM (Fe-RAM), or a resistive RAM (RRAM), but embodiments are not limited to these examples. In addition, the logic chip may be, for example, a microprocessor, an analog device, a digital signal processor, or an application processor, but embodiments are not limited to these examples.

In some exemplary embodiments, the semiconductor package 10 is a high bandwidth memory (HBM) DRAM semiconductor device that includes the first to fifth semiconductor chips 100, 200, 300, 400, and 500. For example, the first semiconductor chip 100 is a buffer chip that includes a serial-parallel conversion circuit and controls the second to fifth semiconductor chips 200, 300, 400, and 500. The second to fifth semiconductor chips 200, 300, 400, and 500 are core chips that include DRAM memory cells. In some exemplary embodiments, the first semiconductor chip 100 is referred to as a master chip, and the second to fifth semiconductor chips 200, 300, 400, and 500 are referred to as slave chips.

Although FIG. 1A illustrates a stack structure in which the second to fifth semiconductor chips are stacked on the first semiconductor chip 100, the number of semiconductor chips stacked on the first semiconductor chip 100 is not limited thereto. For example, two, three, or five or more semiconductor chips may be stacked on the first semiconductor chip 100.

The first semiconductor chip 100 includes a first semiconductor substrate 110, a first semiconductor device layer 120, a first through electrode 130, a first lower connection pad 142, a first upper connection pad 144, and a first connection bump 170.

The first semiconductor substrate 110 includes a horizontal upper surface and a horizontal lower surface that face each other. In an embodiment, the upper surface of the first semiconductor substrate 110 is an active surface, and the lower surface of the first semiconductor substrate 110 is an inactive surface. The first semiconductor device layer 120 is disposed on a lower surface of the first semiconductor substrate 110. The first through electrode 130 penetrates through the first semiconductor substrate 110, extends from the upper surface of the first semiconductor substrate 110 toward the lower surface of the first semiconductor substrate 110, and is electrically connected to a first interconnect structure 140 disposed in the first semiconductor device layer 120. The first lower connection pad 142 is disposed on the first semiconductor device layer 120, and is electrically connected to the first through electrode 130 through the first interconnect structure 140.

The first semiconductor substrate 110 includes, for example, silicon (Si). Alternatively, in an embodiment, the first semiconductor substrate 110 includes a semiconductor element such as germanium (Ge), or a compound semiconductor such as silicon carbide (SiC), gallium arsenide (GaAs), indium arsenide (InAs), or indium phosphide (InP). Alternatively, in an embodiment, the first semiconductor substrate 110 has a silicon on insulator (SOI) structure. For example, the first semiconductor substrate 110 includes a buried oxide (BOX) layer. The first semiconductor substrate 110 includes a conductive region, such as an impurity-doped well or an impurity-doped structure. In addition, the first semiconductor substrate 110 includes various device isolation structures such as a shallow trench isolation (STI) structure.

The first semiconductor device layer 120 includes the first interconnect structure 140 that connects a plurality of individual devices, such as integrated circuit devices, semiconductor devices, passive devices, etc., to other wirings formed on the first semiconductor substrate 110. The first interconnect structure 140 includes a metal interconnect layer and a via plug. For example, the first interconnect structure 140 has a multilayer structure in which two or more metal interconnect layers or two or more via plugs are alternately stacked.

The first through electrode 130 extends from the upper surface of the first semiconductor substrate 110 toward the lower surface of the first semiconductor substrate 110, into the first semiconductor device layer 120, and is electrically connected to the first interconnect structure 140. At least a portion of the first through electrode 130 has a pillar shape.

The first lower connection pad 142 is disposed on a lower surface of the first semiconductor device layer 120, and is electrically connected to the first interconnect structure 140 inside the first semiconductor device layer 120. The first lower connection pad 142 is electrically connected to the first through electrode 130 through the first interconnect structure 140. The first lower connection pad 142 includes at least one of aluminum (Al), copper (Cu), nickel (Ni), tungsten (W), platinum (Pt), or gold (Au).

In addition, a lower passivation layer is disposed on lower surface of the first semiconductor device layer 120 to protect the first interconnect structure 140 in the first semiconductor device layer 120 and other structures thereunder from external impact or moisture. The lower passivation layer exposes a portion of the first lower connection pad 142.

The first upper connection pad 144 is formed on the upper surface of the first semiconductor substrate 110 and is electrically connected to the first through electrode 130. The first upper connection pad 144 includes the same material as the first lower connection pad 142. In addition, an upper passivation layer surrounds a portion of a sidewall of the first through electrode 130 on the upper surface of the first semiconductor substrate 110.

The first connection bump 170 is attached onto the first lower connection pad 142. The first connection bump 170 electrically connects the first semiconductor chip 100 to another substrate outside the semiconductor package 10. At least one of a control signal, a power signal, or a ground signal for the operations of the first to fifth semiconductor chips 100, 200, 300, 400, and 500 are received from the outside through the first connection bump 170. Data signals to be stored in the first to fifth semiconductor chips 100, 200, 300, 400, and 500 are received from the outside through the first connection bump 170. Data stored in the first to fifth semiconductor chips 100, 200, 300, 400, and 500 is transmitted to the outside through the first connection bump 170. The first connection bump 170 may be a pillar structure, a ball structure, or a solder layer, but embodiments are not limited thereto.

The second semiconductor chip 200 includes a second semiconductor device layer 220 that includes a second interconnect structure 240, a second semiconductor substrate 210 disposed above the second semiconductor device layer 220, a second through electrode 230 that is electrically connected to the second interconnect structure 240, a second lower connection pad 242 disposed on a lower surface of the second semiconductor device layer 220, a second upper connection pad 244 disposed on an upper surface of the second semiconductor substrate 210, and a second connection bump 270. The second semiconductor chip 200 is mounted on the upper surface 161 of the first semiconductor chip 100. The second semiconductor chip 200 is mounted on the upper surface of the first semiconductor substrate 110. The second semiconductor chip 200 is electrically connected to the first semiconductor chip 100 through the second connection bump 270 that is interposed between the first semiconductor chip 100 and the second semiconductor chip 200.

The third semiconductor chip 300 includes a third semiconductor device layer 320 that includes a third interconnect structure 340, a third semiconductor substrate 310 disposed above the third semiconductor device layer 320, a third through electrode 330 that is electrically connected to the third interconnect structure 340, a third lower connection pad 342 disposed on a lower surface of the third semiconductor device layer 320, a third upper connection pad 344 disposed on an upper surface of the third semiconductor substrate 310, and a third connection bump 370. The third semiconductor chip 300 is mounted on an upper surface 261 of the second semiconductor chip 200. The third semiconductor chip 300 is electrically connected to the second semiconductor chip 200 through the third connection bump 370 interposed between the second semiconductor chip 200 and the third semiconductor chip 300.

The fourth semiconductor chip 400 includes a fourth semiconductor device layer 420 that includes a fourth interconnect structure 440, a fourth semiconductor substrate 410 disposed above the fourth semiconductor device layer 420, a fourth through electrode 430 that is electrically connected to the fourth interconnect structure 440, a fourth lower connection pad 442 disposed on a lower surface of the fourth semiconductor device layer 420, a fourth upper connection pad 444 disposed on an upper surface of the fourth semiconductor substrate 410, and a fourth connection bump 470. The fourth semiconductor chip 400 is mounted on an upper surface of the third semiconductor chip 300. The fourth semiconductor chip 400 is electrically connected to the third semiconductor chip 300 through the fourth connection bump 470 interposed between the third semiconductor chip 300 and the fourth semiconductor chip 400.

The fifth semiconductor chip 500 includes a fifth semiconductor device layer 520 that includes a fifth interconnect structure 540, a fifth semiconductor substrate 510 disposed above the fifth semiconductor device layer 520, a fifth lower connection pad 542 disposed on a lower surface of the fourth semiconductor device layer 520, and a fifth connection bump 570. The fifth semiconductor chip 500 is mounted on an upper surface of the fourth semiconductor chip 400. The fifth semiconductor chip 500 is electrically connected to the fourth semiconductor chip 400 through the fifth connection bump 570 interposed between the fourth semiconductor chip 400 and the fifth semiconductor chip 500. Unlike the first to fourth semiconductor chips 100, 200, 300, and 400, the fifth semiconductor chip 500 does not include a through electrode and an upper connection pad.

Because the second to fifth semiconductor chips 200, 300, 400, and 500 have technical characteristics identical to or similar to those of the first semiconductor chip 100, to the extent that a detailed description of these elements is omitted, it may be assumed that the descriptions of these elements are at least similar to the corresponding description of the first semiconductor chip 100.

The first underfill material layer 630 is formed between the first semiconductor chip 100 and the second semiconductor chip 200. The first underfill material layer 630 is filled between the first semiconductor chip 100 and the second semiconductor chip 200 and surrounds sidewalls of the second connection bump 270. The first underfill material layer 630 protrudes laterally, i.e., in a horizontal direction, from a sidewall 265 of the second semiconductor chip 200, and covers at least a portion of the sidewall 265 of the second semiconductor chip 200.

The second underfill material layer 651 is interposed between the upper surface 261 of the second semiconductor chip 200 and a lower surface of the third semiconductor chip 300, the third underfill material layer 653 is interposed between the third semiconductor chip 300 and the fourth semiconductor chip 400, and the fourth underfill material layer 655 is interposed between the fourth semiconductor chip 400 and the fifth semiconductor chip 500. The second underfill material layer 651 protrudes laterally, i.e., in a horizontal direction, from sidewalls of the second semiconductor chip 200 and the third semiconductor chip 300, and covers a portion of the sidewall 265 of the second semiconductor chip 200 and a portion of a sidewall of the third semiconductor chip 300. The third underfill material layer 653 protrudes laterally, i.e., in a horizontal direction, from sidewalls of the third semiconductor chip 300 and the fourth semiconductor chip 400, and covers a portion of the sidewall the third semiconductor chip 300 and a portion of the sidewall of the fourth semiconductor chip 400. The fourth underfill material layer 655 protrudes laterally, i.e., in a horizontal direction, from sidewalls of the fourth semiconductor chip 400 and the fifth semiconductor chip 500, and covers a portion of the sidewall the fourth semiconductor chip 400 and a portion of the sidewall of the fifth semiconductor chip 500.

The first to fourth underfill material layers 630, 651, 653, and 655 include an adhesive resin and a flux. The adhesive resin may be, for example, a thermosetting resin. When heat or pressure is applied to the adhesive resin, the adhesive resin changes from a gel state to a liquid state and is then cured. In general, in a process of manufacturing the semiconductor package 10, the sidewall of the underfill material layer includes a curved surface. The flux is used in soldering the electrical bonding between the semiconductor chips in a process of manufacturing the semiconductor package 10. The flux increases the spreadability and wettability of a solder, and the flux can be pre-applied onto a region to be soldered, or can be incorporated into the underfill material layer. The flux can be classified as a resin-based flux, an organic-based flux, or an inorganic-based flux, and the resin-based flux is commonly used in an electronic device.

The semiconductor package 10 includes a first dam structure 610 disposed on the upper surface 161 of the first semiconductor chip 100. The first dam structure 610 surrounds the second semiconductor chip 200. That is, the first dam structure 610 is laterally or horizontally spaced apart from the edge of the second semiconductor chip 200. The first dam structure 610 extends along the edge of the second semiconductor chip 200, and is spaced apart from the second semiconductor chip 200 by a first horizontal distance D1.

The first dam structure 610 includes a plurality of slits 615, and a plurality of bar-shaped or line-shaped unit dam structures that are separated by the slits 615 and that extend linearly along the edge of the second semiconductor chip 200. The slits 615 at least partially pass through the first dam structure 610 in the vertical direction, such as the Z direction. The plurality of unit dam structures are spaced apart from each other by the slits 615.

The first dam structure 610 extends along an imaginary line that surrounds the second semiconductor chip 200 in a plan view. For example, if the second semiconductor chip 200 has a rectangular shape that includes first to fourth edges 271, 272, 273, and 274 in a plan view, the first dam structure 610 extends along an imaginary rectangular line that surrounds the second semiconductor chip 200 in a plan view. For example, the first dam structure 610 includes unit dam structures arranged in a direction, such as the Y direction, parallel to the first edge 271 of the second semiconductor chip 200, and the second edge 272 of the second semiconductor chip 200, and unit dam structures arranged in a direction, such as the X direction, parallel to the third edge 273 of the second semiconductor chip 200 and the fourth edge 274 of the second semiconductor chip 200. The first dam structure 610 block the flow of the underfill material that flows from the center to the edge of the first semiconductor chip 100 during an underfill formation process of the first underfill material layer 630, controlling the final shape of the first underfill material layer 630 and defining a formation region of the first underfill material layer 630. The first underfill material layer 630 protrudes outward in a horizontal direction from the sidewall 265 of the second semiconductor chip 200, and is formed inside the imaginary rectangular line around which the first dam structure 610 is arranged.

Because the formation region of the first underfill material layer 630 is defined by the first dam structure 610, the first underfill material layer 630 protrudes from the sidewall 265 of the second semiconductor chip 200, and thus, a length in the horizontal direction is less than or equal to a first horizontal distance D1 between the first dam structure 610 and the second semiconductor chip 200. In exemplary embodiments, the first horizontal distance D1 between the first dam structure 610 and the second semiconductor chip 200 is between about 30% and about 70% of a second horizontal distance D2 between the edge of the second semiconductor chip 200 and the edge of the first semiconductor chip 100.

In exemplary embodiments, the first dam structure 610 covers at least about 50% or more of each edge of the second semiconductor chip 200. For example, letting a first length of one edge of the second semiconductor chip 200 be 275, a length 625 of the first dam structure 610 that extends along the one edge of the second semiconductor chip 200 is between about 50% and about 90% of the first length 275 of the one edge of the second semiconductor chip 200.

The first dam structure 610 includes a first sidewall 611 in contact with the first underfill material layer 630. The first sidewall 611 of the first dam structure 610 faces the second semiconductor chip 200, and may be referred to as an inner wall of the first dam structure 610. The first sidewall 611 of the first dam structure 610 is at least partially covered by the first underfill material layer 630. In exemplary embodiments, the first sidewall 611 of the first dam structure 610 is completely covered by the first underfill material layer 630.

The first sidewall 611 of the first dam structure 610 faces the sidewall 265 of the second semiconductor chip 200, and includes a flat surface parallel to the sidewall 265 of the second semiconductor chip 200. Because a shape of a lower sidewall 631 of the first underfill material layer 630 is determined by the shape of the first sidewall 611 in contact with the lower sidewall 631, the lower sidewall 631 of the first underfill material layer 630 has a planar shape.

In exemplary embodiments, the unit dam structures of the first dam structure 610 extend parallel to the edge of the second semiconductor chip 200. In exemplary embodiments, each of the unit dam structures of the first dam structure 610 has a rectangular horizontal cross-section in a plan view.

Each of the unit dam structures of the first dam structure 610 have a first horizontal width 621 in a direction parallel to an edge of the second semiconductor chip 200 that faces the first unit dam structures. In exemplary embodiments, the first horizontal width 621 of each of the unit dam structures of the first dam structure 610 is between about 30 µm and about 150 µm, or between about 60 µm and about 100 µm.

In exemplary embodiments, an interval 623 between adjacent unit dam structures, i.e., the width of the slit 615 between the adjacent dam structures, is about 100% or less of the horizontal width 621 of the unit dam structures. In exemplary embodiments, the interval 623 between the adjacent unit dam structures is about 60 µm or less, about 40 µm or less, or about 20 µm or less. In exemplary embodiments, the interval 623 between the adjacent unit dam structures is about 2 µm or more. Due to the width of the slit 615 between adjacent the unit dam structures of the first dam structure 610 and the viscosity of the underfill material of the first underfill material layer 630, the underfill material does not penetrate into the slit 615 of the first dam structure 610, and the lower sidewall 631 of the first underfill material layer 630 forms to have a planar shape that corresponds to the flat first sidewall 611 of the first dam structure 610. When the interval 623 between the unit dam structures of the first dam structure 610 is too large, the underfill material of the first underfill material layer 630 penetrates into the gap between the unit dam structures, and thus, the first underfill material layer 630 forms with uneven sidewalls.

When the dam that controls the flow of the first underfill material layer 630 has an integral ring shape that surrounds the second semiconductor chip 200 or has a structure that continuously extends with size similar to the length of one edge of the second semiconductor chip 200, stress due to shrinkage of the underfill material in a process of forming the first underfill material layer 630 can cause collapse and damage to the dam. However, according to exemplary embodiments of the inventive concept, because the first dam structure 610 includes hundreds plurality of unit dam structures separated by slits and arranged along each edge of the second semiconductor chip 200, damage to the first dam structure 610 due to shrinkage of the underfill material can be prevented in a process of forming the first underfill material layer 630, and a shape of the first underfill material layer 630 can be controlled and reproduced using the first dam structure 610.

In exemplary embodiments, the first dam structure 610 includes a metal. For example, the first dam structure 610 includes a metal such as copper (Cu), aluminum (Al), or tungsten (W). When the first dam structure 610 includes a metal, the first dam structure 610 is a dummy metal pattern that is not electrically connected to a circuit of the first semiconductor chip 100 and a circuit of the second semiconductor chip 200.

In other exemplary embodiments, the first dam structure 610 includes a polymer. For example, the first dam structure 610 includes a photoresist material.

In exemplary embodiments, a vertical level LV1 of the upper surface 613 of the first dam structure 610 is located between a vertical level LV2 of the upper surface 261 of the second semiconductor chip 200 and a vertical level LV3 of the lower surface 263 of the second semiconductor chip 200. A vertical distance between the upper surface 613 of the first dam structure 610 and the upper surface 161 of the first semiconductor chip 100 is less than a vertical distance between the upper surface 261 of the second semiconductor chip 200 and the upper surface 161 of the first semiconductor chip 100 and greater than a vertical distance between the lower surface 263 of the second semiconductor chip 200 and the upper surface 161 of the first semiconductor chip 100. When the vertical level LV1 of the upper surface 613 of the first dam structure 610 is higher than the vertical level LV2 of the upper surface 261 of the second semiconductor chip 200, physical interference may occur between a bonding head (see BH of FIG. 2C) and the first dam structure 610 during a thermocompression underfill process that stacks the second semiconductor chip 200 on the first semiconductor chip 100. When the vertical level LV1 of the upper surface 613 of the first dam structure 610 is lower than the vertical level LV3 of the lower surface 263 of the second semiconductor chip 200, the first underfill material layer 630 may overflow beyond the first dam structure 610 during an underfill process that forms the first underfill material layer 630.

The semiconductor package 10 includes a molding layer 670 disposed on the upper surface 161 of the first semiconductor chip 100 and that covers the second to fifth semiconductor chips 200, 300, 400, and 500. The molding layer 670 surrounds the second to fifth semiconductor chips 200, 300, 400, and 500. Specifically, the molding layer 670 surrounds the sidewalls of the second to fifth semiconductor chips 200, 300, 400, and 500, and surrounds the first to fourth underfill material layers 630, 651, 653, and 655. In addition, the molding layer 670 covers the upper surface 613 and the outer wall of the first dam structure 610. In exemplary embodiments, the molding layer 670 covers the upper surface of the fifth semiconductor chip 500. In other exemplary embodiments, the molding layer 670 exposes the upper surface of the fifth semiconductor chip 500. The molding layer 670 includes, for example, an epoxy molding compound (EMC).

In addition to miniaturization and weight reduction, the semiconductor package 10 used in electronic products needs high performance and large capacity.

To miniaturize and reduce the weight of the semiconductor package 10 in which the semiconductor chips are stacked, the thicknesses of the semiconductor chips are structurally reduced. Therefore, in a process of stacking the semiconductor chips, the underfill material layer is used as an interlayer bonding material between the semiconductor chips that uniformly bonds the semiconductor chips, bonds fine-sized connection bumps, solder wettability, electrical reliability, structural reliability, etc.

When the shape of the first underfill material layer 630 is non-uniform or the size of the first underfill material layer 630 that protrudes from the second semiconductor chip 200 is non-uniform, warpage generated due to a mismatch in thermal expansion coefficients between the first underfill material layer 630 and other components in the semiconductor package 10 might not be controllable. However, according to exemplary embodiments of the inventive concept, because the shape of the first underfill material layer 630 is uniformly controlled by the first dam structure 610, warpage generated due to mismatches in the thermal expansion coefficients is effectively controlled.

FIGS. 2A to 2G are cross-sectional views that illustrate a method of manufacturing a semiconductor package 10, according to exemplary embodiments of the inventive concept. Hereinafter, a method of manufacturing the semiconductor package 10 described with reference to FIGS. 1A to 1C will be described with reference to FIGS. 2A to 2G.

Figure 2A:
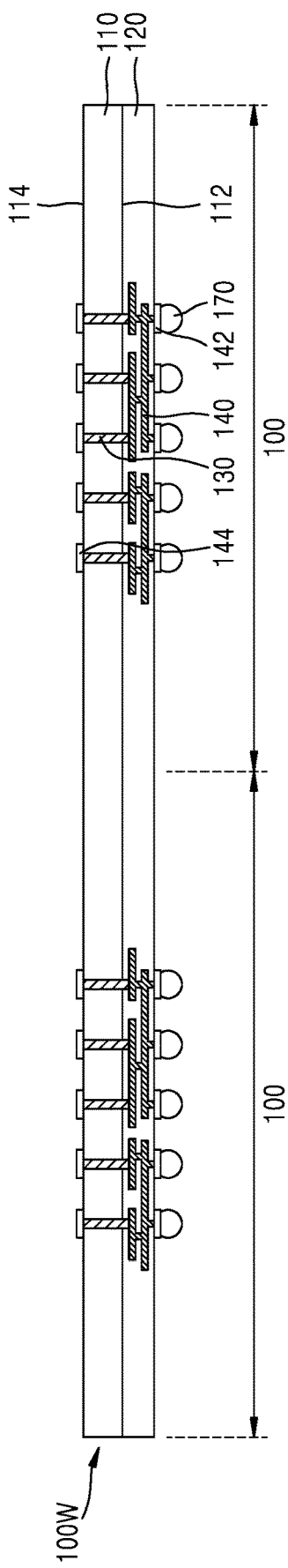
FIGS. 2A to 2G are cross-sectional views that illustrate a method of manufacturing a semiconductor package, according to exemplary embodiments of the inventive concept.

Referring to FIG. 2A, in an embodiment, a semiconductor wafer 100W is prepared that includes a plurality of first semiconductor chips 100 that are separated from each other.

The semiconductor wafer 100W includes a first semiconductor substrate 110, a first semiconductor device layer 120, and a first through electrode 130. The first semiconductor substrate 110 includes a lower surface 112 and an upper surface 114 that face each other. The first semiconductor device layer 120 is formed on an active surface of the first semiconductor substrate 110, that is, a lower surface 112 of the first semiconductor substrate 110, and includes a first interconnect structure 140 provided therein. The first through electrode 130 penetrates through at least a portion of the first semiconductor substrate 110, and is connected to the first interconnect structure 140 the first semiconductor device layer 120.

A first connection pad 142 and a first connection bump 170 that are electrically connected to the first through electrode 130 are formed on the lower surface 112 of the first semiconductor substrate 110. The first connection bump 170 has a convex shape. The first connection pad 142 is formed by depositing a metal layer on the lower surface 112 of the first semiconductor substrate 110 and then patterning the metal layer.

To form the first connection bump 170, a mask pattern that includes an opening that exposes a portion of the first connection pad 142 is formed on the first semiconductor device layer 120, and a conductive material layer that constitutes the first connection bump 170 is formed on the exposed portion of the first connection pad 142. The conductive material layer of the first connection bump 170 includes a pillar structure and a solder layer that are sequentially formed by a plating process. The mask pattern is removed, and a reflow process is performed that forms the first connection bump 170.

An upper passivation layer that covers an inactive surface of the first semiconductor substrate 110, that is, the upper surface 114 of the first semiconductor substrate 110, is selectively formed, and a first upper connection pad 144 that is electrically connected to the first through electrode 130 is formed on the upper passivation layer. The upper passivation layer is formed to expose the first through electrode 130. The upper passivation layer includes, for example, an insulating polymer material.

Figure 2B:
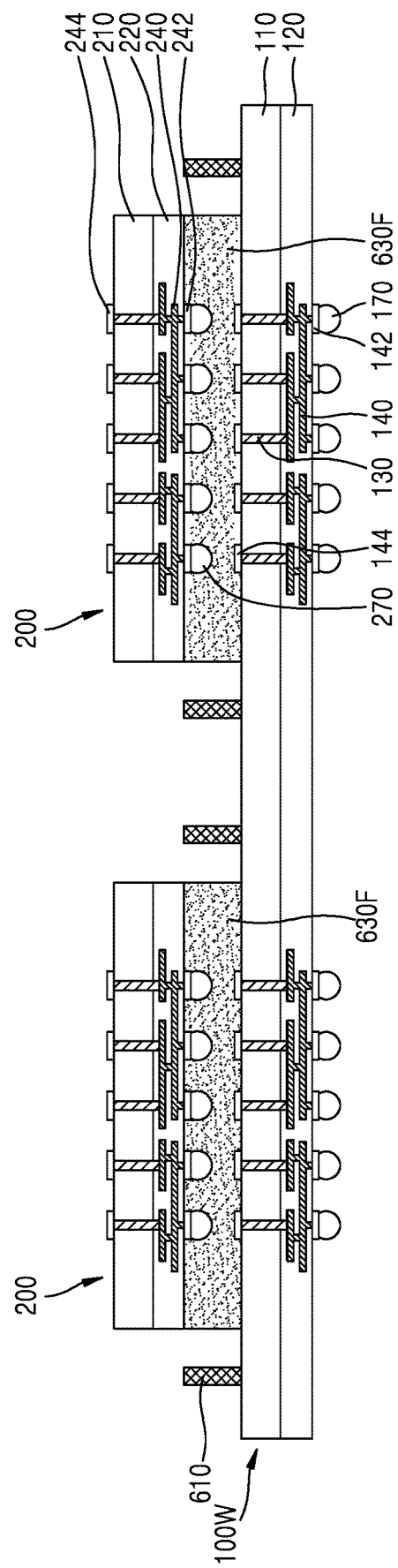

Referring to FIG. 2B, in an embodiment, a first dam structure 610 is formed on the semiconductor wafer 100W. The first dam structure 610 extends along an imaginary rectangular line on the semiconductor wafer 100W, and defines a chip mounting region.

After the first dam structure 610 is formed, second semiconductor chips 200 to which an underfill material 630F is attached are prepared, and the second semiconductor chips 200 are mounted on the semiconductor wafer 100W. Each of the second semiconductor chips 200 is mounted in the chip mounting region defined by the first dam structure 610. The underfill materials 630F is interposed between the semiconductor wafer 100W and the second semiconductor chips 200. Second connection bumps 270 of the second semiconductor chip 200 are vertically aligned with the first upper connection pads 144 of the semiconductor wafer 100W.

Figure 2C:
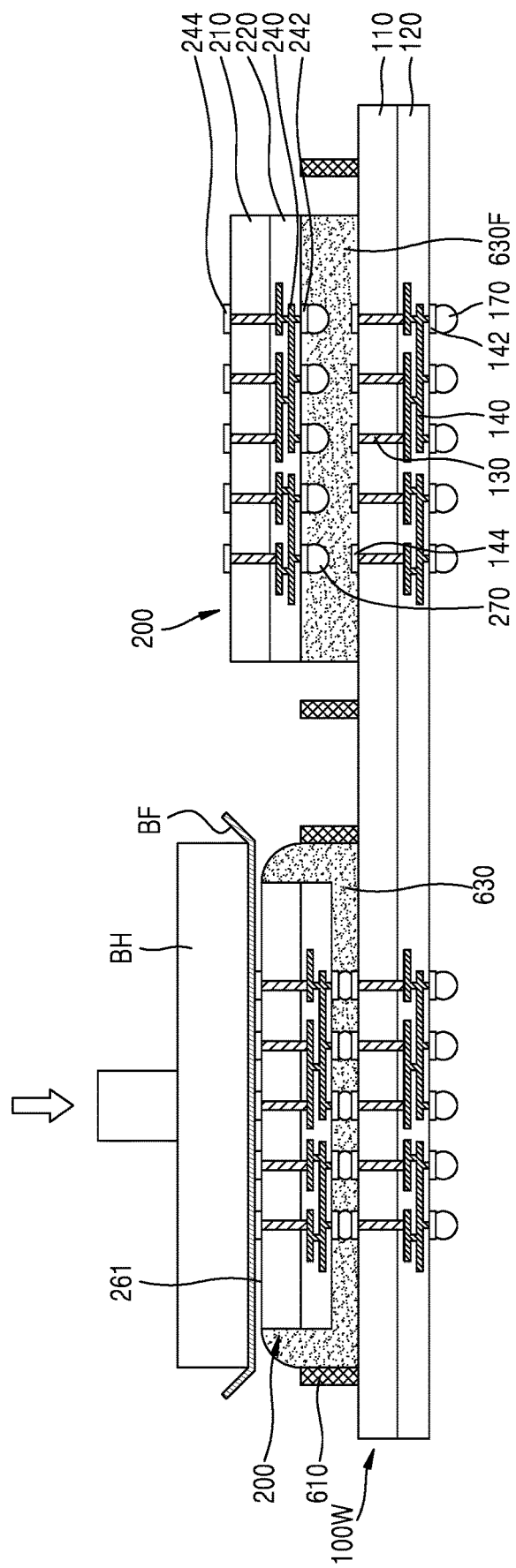

Referring to FIG. 2C, in an embodiment, a bonding foil BF for a thermocompression underfill process is interposed between a bonding head BH and the second semiconductor chip 200, and heat and pressure are applied to the second semiconductor chip 200 on the left side in FIG. 2C by using the bonding head BH. The planar area of the lower portion of the bonding head BH is greater than the planar area of the second semiconductor chip 200. For example, the lower surface of the bonding head BH completely covers the upper surface 261 of the second semiconductor chip 200. The bonding foil BF prevents contamination from occurring on the lower surface of the bonding head BH. The bonding foil BF is designed to be supplied as a roll from a first roller and wound back into a roll in a second roller after the thermocompression bonding. As such, the bonding foil BF can be supplied continuously, and the bonding foil BF can be kept tight during the thermocompression bonding.

When heat and pressure are applied to the second semiconductor chip 200 by the bonding head BH, the underfill material 630F changes to a liquid phase and flows in the peripheral direction of the second semiconductor chip 200. In this case, the first dam structure 610 blocks the flow of the underfill material 630F flowing in the peripheral direction of the second semiconductor chip 200. The liquid underfill material 630F is cured to form a first underfill material layer 630. The first underfill material layer 630 is formed in a region surrounded by the first dam structure 610.

Figure 2D:
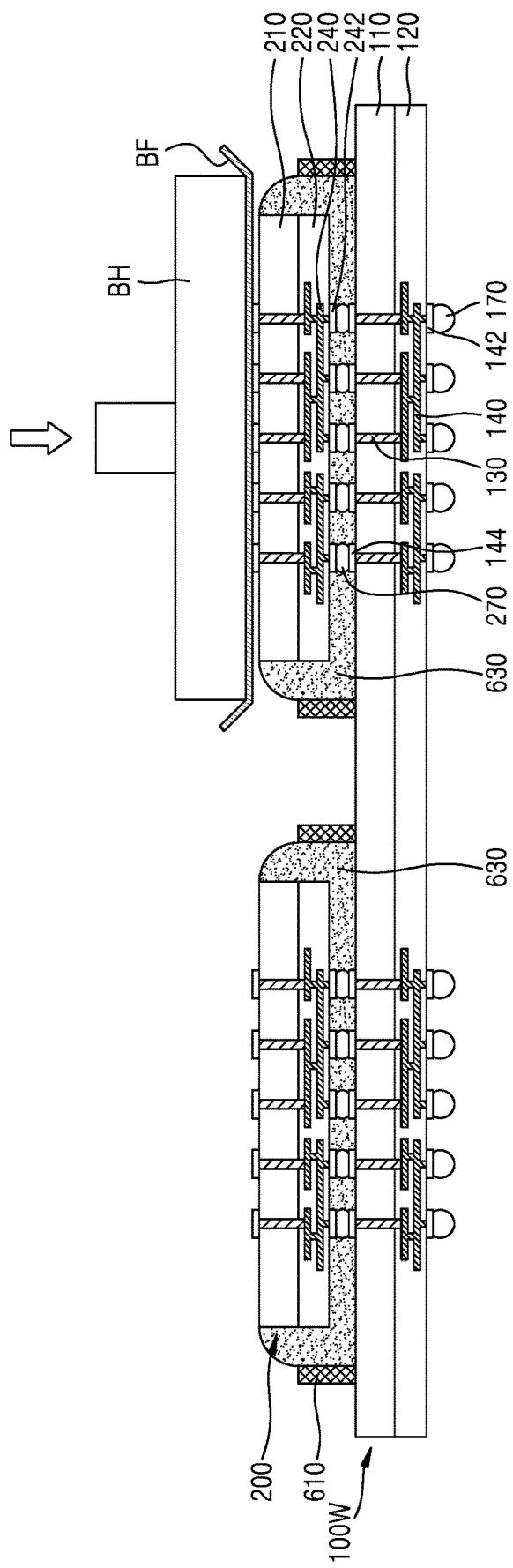

Referring to FIG. 2D, in an embodiment, a bonding foil BF is interposed between the second semiconductor chip 200 on the right side in FIG. 2D and the bonding head BH, and heat and pressure are applied to the second semiconductor chip 200 by the bonding head BH. During a thermocompression underfill process of the second semiconductor chip 200, the liquid underfill material 630F is prevented from overflowing to the surroundings beyond the first dam structure 610 and toward the other second semiconductor chip 200. Therefore, in a thermocompression underfill process of the second semiconductor chip 200, consequences due to the underfill material 630F overflowing in the thermocompression underfill process are prevented.

Figure 2E:
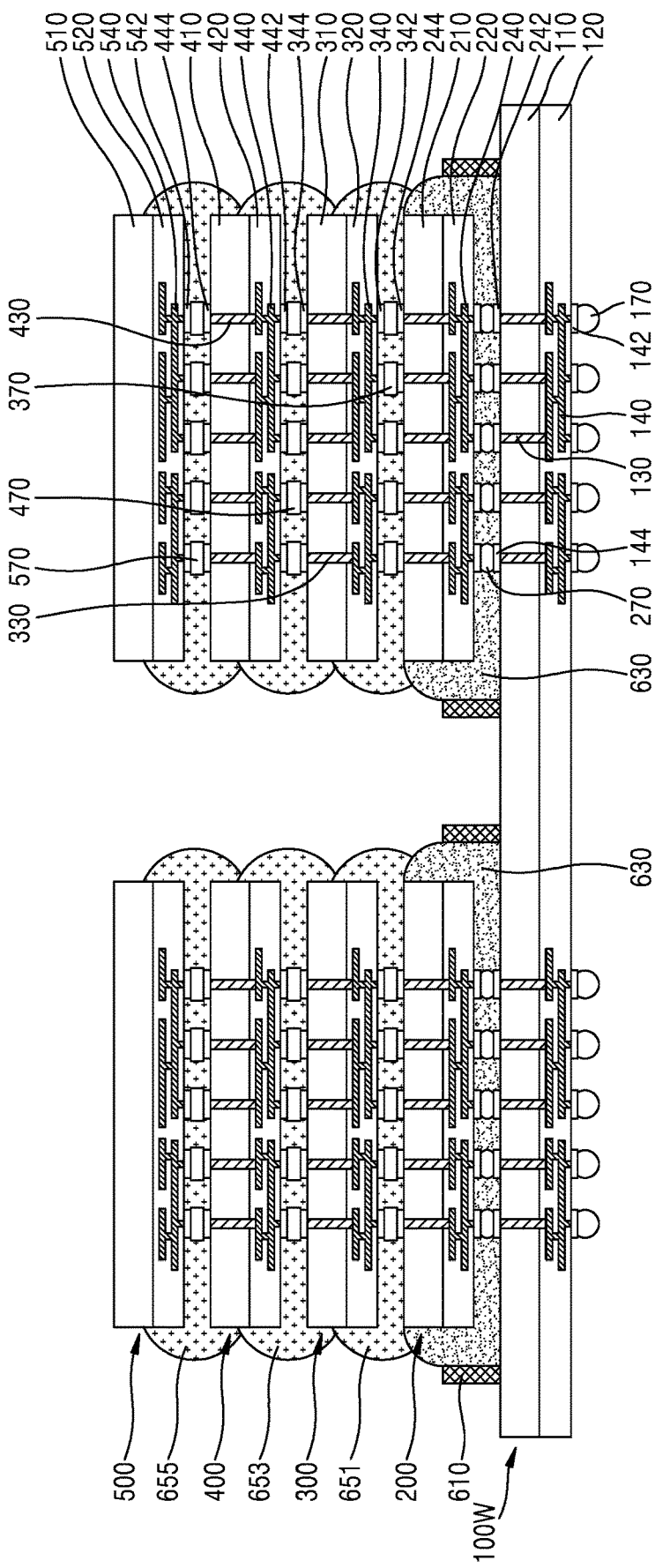

Referring to FIG. 2E, in an embodiment, a third semiconductor chip 300, a fourth semiconductor chip 400, and a fifth semiconductor chip 500 are sequentially stacked on each of the second semiconductor chips 200 mounted on the semiconductor wafer 100W. The third semiconductor chips 300 to which is attached an underfill member that constitutes the second underfill material layer 651 is disposed on the second semiconductor chips 200, and a thermocompression underfill process is performed thereon so that the third semiconductor chips 300 are stacked on the second semiconductor chips 200. Through substantially the same process as that of stacking the third semiconductor chips 300 on the second semiconductor chips 200, the fourth semiconductor chips 400 are stacked on the third semiconductor chips 300, and the fifth semiconductor chips 500 are stacked on the fourth semiconductor chips 400.

Figure 2F:
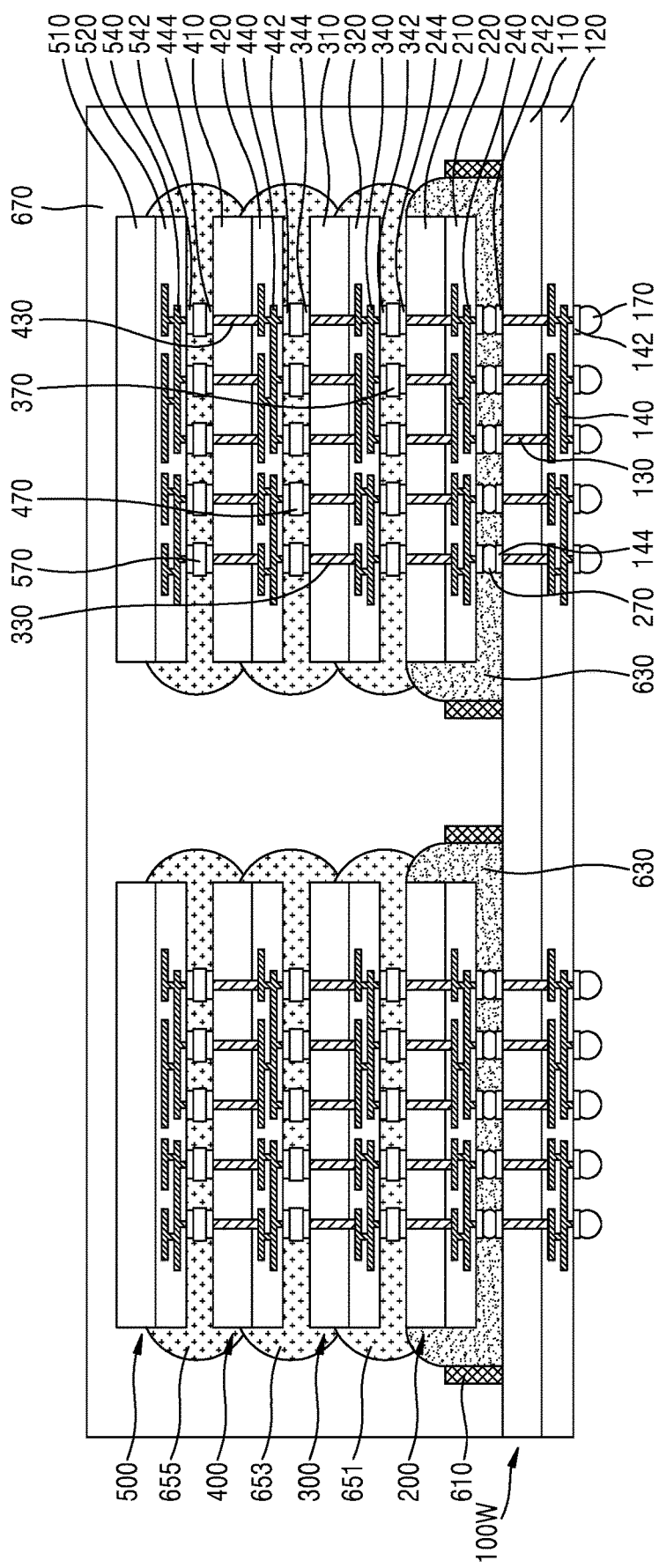

Referring to FIG. 2F, in an embodiment, a molding layer 670 that covers the second to fifth semiconductor chips 200, 300, 400, and 500 is formed on the semiconductor wafer 100W. The molding layer 670 is formed to cover sidewalls of the second to fifth semiconductor chips 200, 300, 400, and 500 and the upper surface of the fifth semiconductor chip 500. In addition, the molding layer 670 is formed to cover the first to fourth underfill material layers 630, 651, 653, and 655 and to cover the first dam structure 610.

Figure 2G:
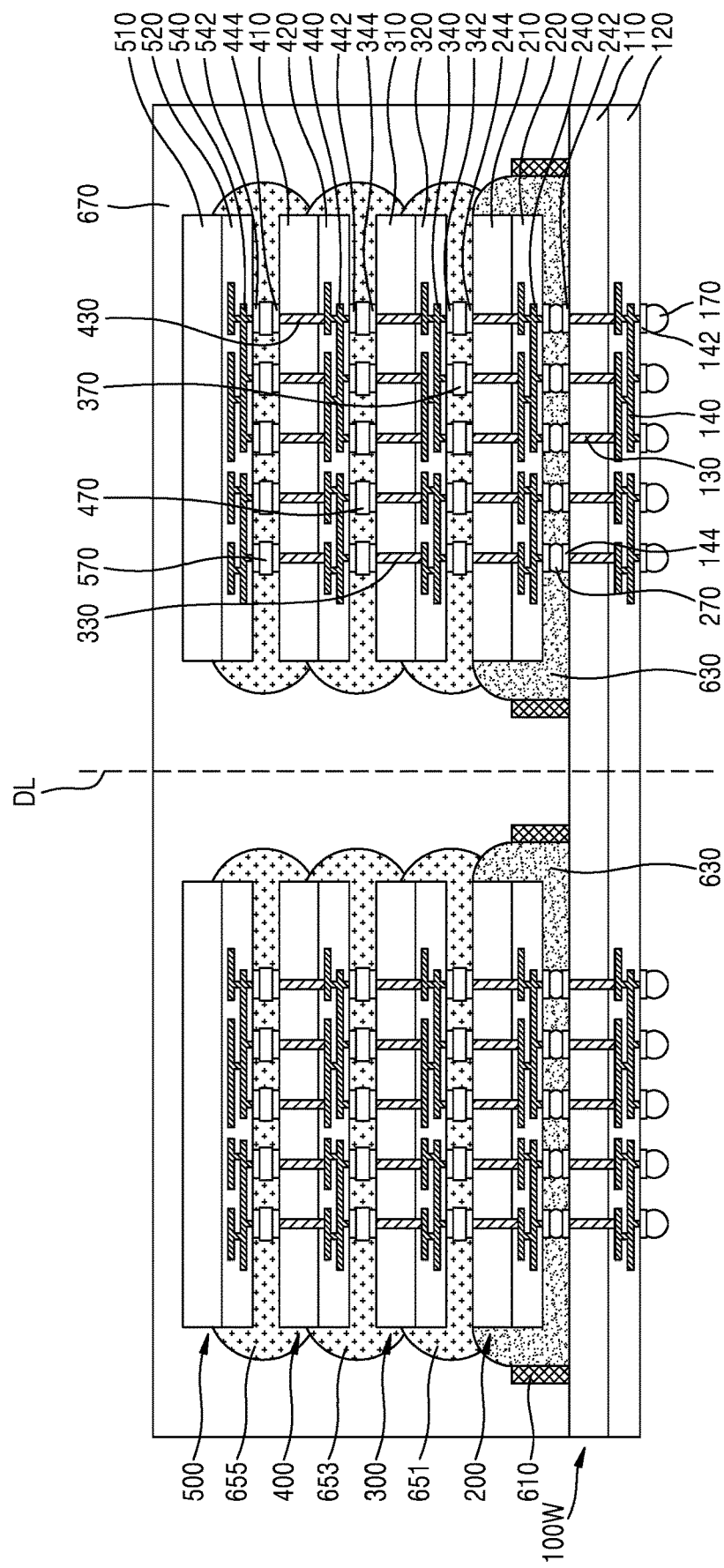

Referring to FIG. 2G, in an embodiment, a cutting process is performed along a dicing line DL to divide the result of FIG. 2F into a plurality of semiconductor packages 10 of FIG. 1A, each including the first to fifth semiconductor chips 100, 200, 300, 400, and 500.

Figure 3A:
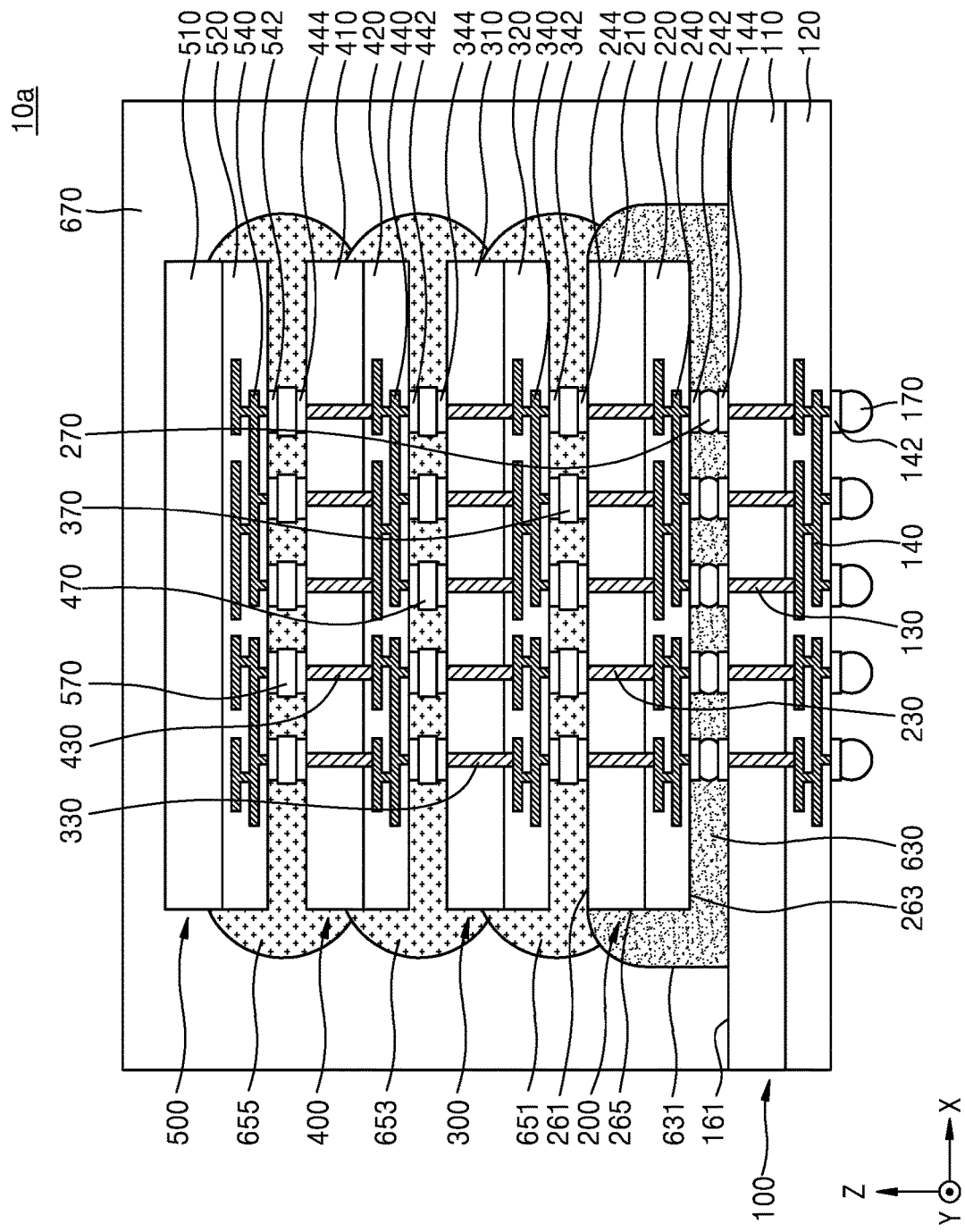
FIG. 3A is a cross-sectional view of a semiconductor package according to exemplary embodiments of the inventive concept.
Figure 3B:
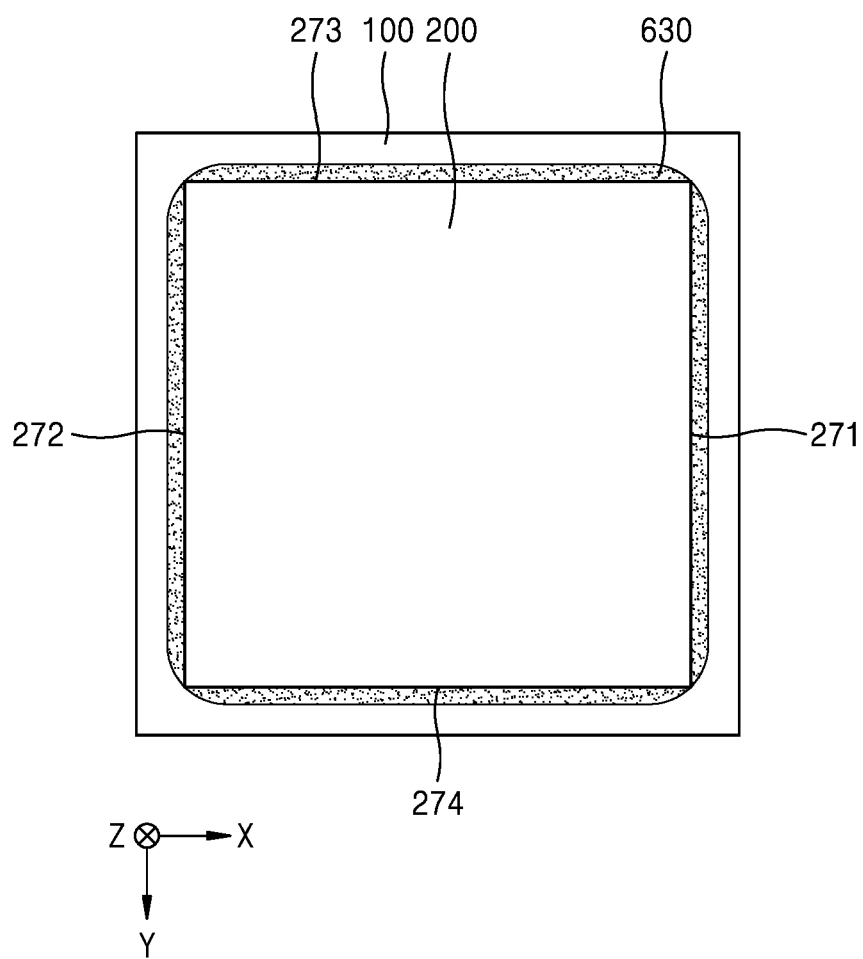
FIG. 3B is a plan view of a semiconductor package of FIG. 3A.

FIG. 3A is a cross-sectional view of a semiconductor package 10a according to exemplary embodiments of the inventive concept. FIG. 3B is a plan view of the semiconductor package 10a of FIG. 3A. Hereinafter, the semiconductor package 10a illustrated in FIGS. 3A and 3B will be described focusing on differences from the semiconductor package 10 described with reference to FIGS. 1A to 1C.

Referring to FIGS. 3A and 3B, in an embodiment, the semiconductor package 10a includes first to fifth semiconductor chips 100, 200, 300, 400, and 500, first to fourth underfill material layers 630, 651, 653, and 655, and a molding layer 670. The semiconductor package 10a of FIGS. 3A and 3B is substantially the same as or similar to the semiconductor package 10 described with reference to FIGS. 1A to 1C, except that the semiconductor package 10a of FIGS. 3A and 3B does not include the first dam structure 610 of FIG. 1A.

For example, to manufacture the semiconductor package 10a as described with reference to FIG. 2D, a plurality of second semiconductor chips 200 are stacked on the semiconductor wafer 100W by using a first underfill material layer 630, and the first dam structure 610 is removed. The first dam structure 610 includes a polymer such as a photoresist, and is removed through a strip process after completing a thermocompression underfill process that forms the first underfill material layer 630. After the first dam structure 610 is removed, the semiconductor package 10a illustrated in FIGS. 3A and 3B is manufactured by sequentially stacking third to fifth semiconductor chips 300, 400, and 500 on the second semiconductor chips 200, forming a molding layer 670, and performing a dicing process thereon. The stacking of the third to fifth semiconductor chips 300, 400, and 500 on the second semiconductor chips 200 is substantially the same as a chip stacking described with reference to FIG. 2E, the forming of the molding layer 670 is substantially the same as a method of forming the molding layer 670 described with reference to FIG. 2F, and the dicing process is substantially the same as a dicing process described with reference to FIG. 2G.

In a process of manufacturing the semiconductor package 10a illustrated in FIGS. 3A and 3B, a lower sidewall 631 of the first underfill material layer 630 exposed by removing the first dam structure 610 includes a flat surface and is covered by the molding layer 670. The lower sidewall 631 of the first underfill material layer 630 has a profile that extends perpendicular to the upper surface 161 of the first semiconductor chip 100 and parallel to the edge of the second semiconductor chip 200 in a cross-sectional view.

Figure 4A:
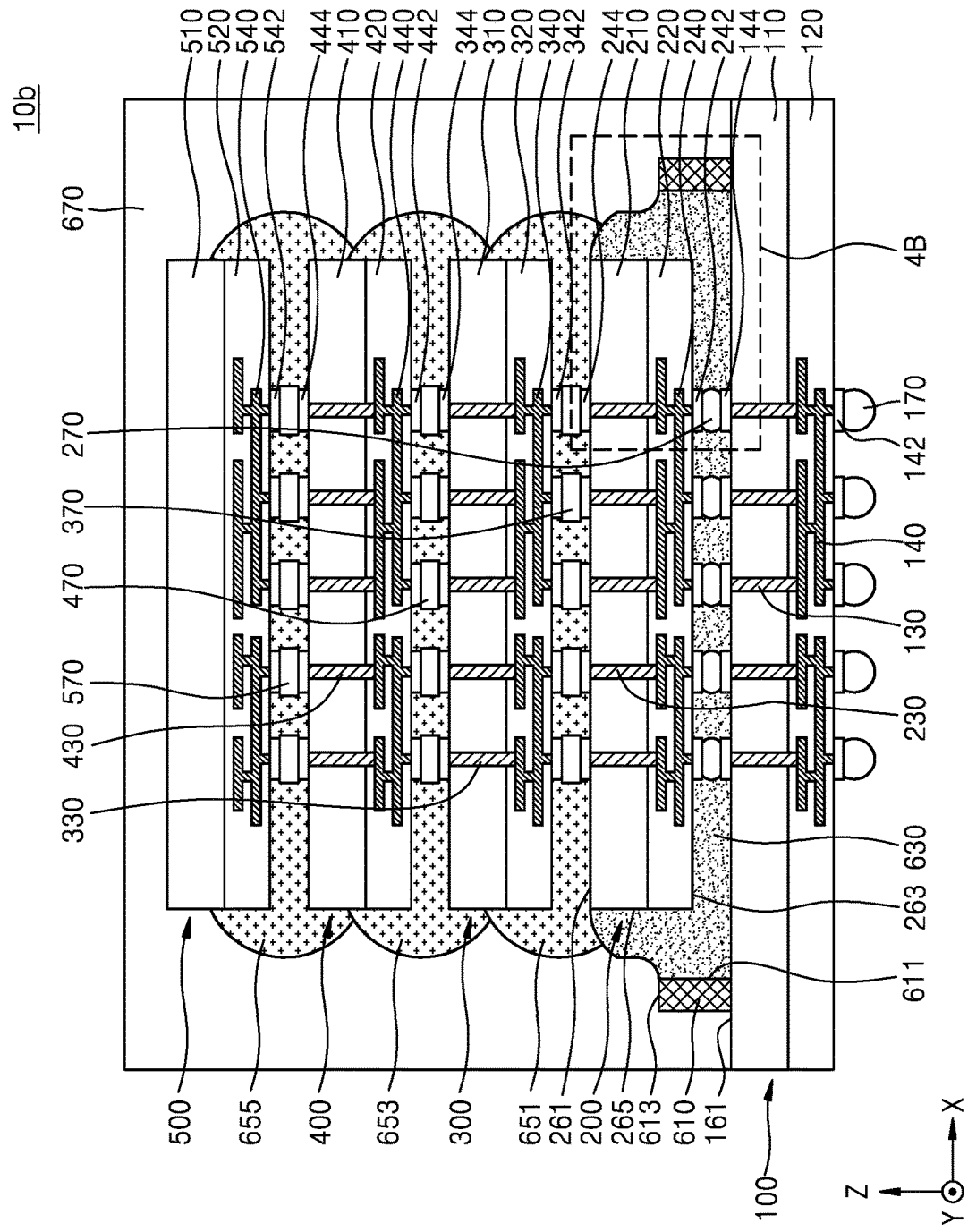
FIG. 4A is a cross-sectional view of a semiconductor package according to exemplary embodiments of the inventive concept.
Figure 4B:
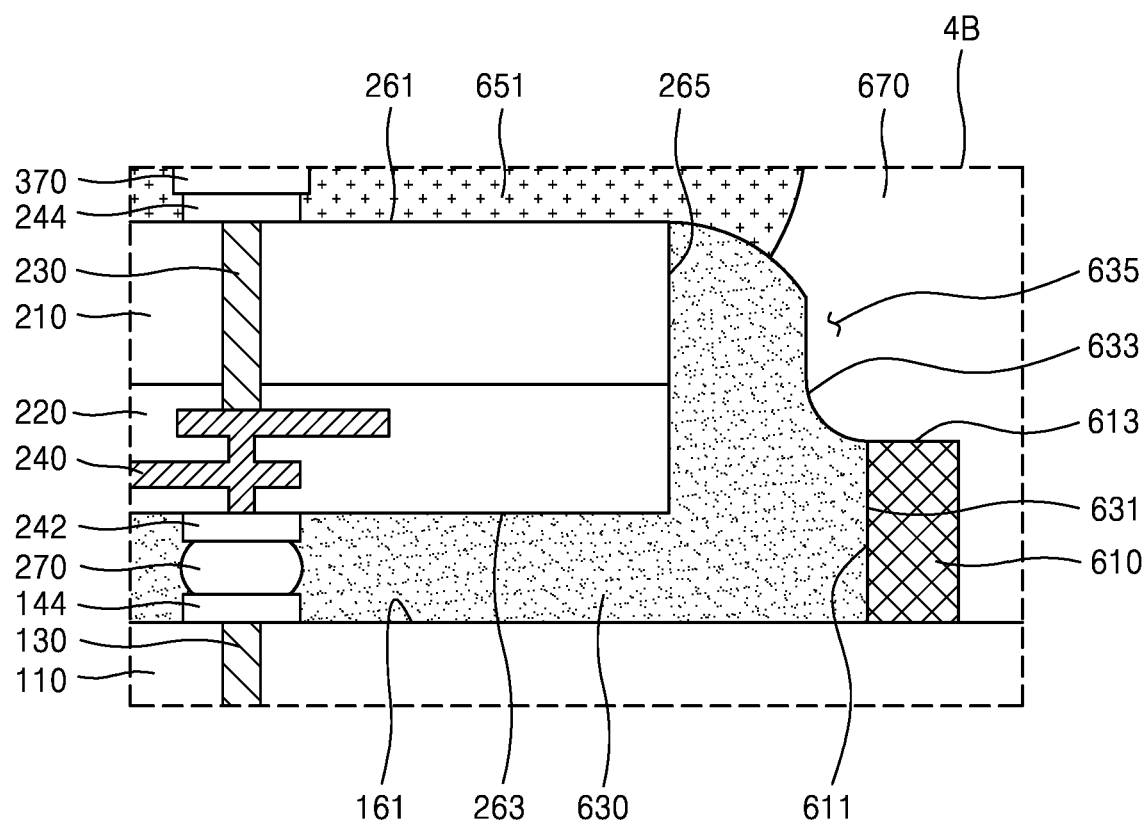
FIG. 4B is an enlarged view of a portion "4B" in FIG. 4A.

FIG. 4A is a cross-sectional view of a semiconductor package 10b according to exemplary embodiments of the inventive concept. FIG. 4B is an enlarged view of g a portion "4B" in FIG. 4A. Hereinafter, the semiconductor package 10b illustrated in FIGS. 4A and 4B will be described focusing on differences from the semiconductor package 10 described with reference to FIGS. 1A to 1C.

Referring to FIGS. 4A and 4B, in an embodiment, the semiconductor package 10b includes first to fifth semiconductor chips 100, 200, 300, 400, and 500, first to fourth underfill material layers 630, 630, 651, 653, and 655, a first dam structure 610, and a molding layer 670.

The first underfill material layer 630 includes a lower sidewall 631 and an upper sidewall 633 connected to the lower sidewall 631. As illustrated in FIGS. 4A and 4B, the lower sidewall 631 of the first underfill material layer 630 extends along the first sidewall 611 of the first dam structure 610 from the lower end to the upper end of the first sidewall 611, and the upper sidewall 633 of the first underfill material layer 630 is connected to the upper end of the lower sidewall 631. The lower sidewall 631 of the first underfill material layer 630 is in contact with the first sidewall 611 of the first dam structure 610, and the upper sidewall 633 of the first underfill material layer 630 is in contact with the molding layer 670.

The lower sidewall 631 of the first underfill material layer 630 is a linear sidewall that extends along the first sidewall 611 of the first dam structure 610. For example, the lower sidewall 631 of the first underfill material layer 630 has a profile that extends from an upper surface 161 of the first semiconductor chip 100 in the vertical direction, such as the Z direction.

The upper sidewall 633 of the first underfill material layer 630 includes a curved surface. The upper sidewall 633 of the first underfill material layer 630 includes a concave curvilinear sidewall. The upper sidewall 633 of the first underfill material layer 630 is continuously connected to an upper surface 613 of the first dam structure 610. At the boundary between the upper sidewall 633 and the upper surface 613 of the first dam structure 610, a slope of the upper sidewall 633 is equal to a slope of the upper surface 613 of the first dam structure 610.

The first underfill material layer 630 includes an indentation 635 formed by the concave upper sidewall 633. The indentation 635 of the first underfill material layer 630 extends continuously and linearly in a horizontal direction along the edge of the second semiconductor chip 200 or in the extension direction of the first dam structure 610 in a plan view. In exemplary embodiments, the length of the indentation 635 of the first underfill material layer 630 along the edge of the second semiconductor chip 200 is between about 50% and about 90% of the length of the edge of the second semiconductor chip 200. In exemplary embodiments, the indentation 635 of the first underfill material layer 630 has a rectangular ring shape that continuously extends along the edges of the second semiconductor chip 200 to surround the edges of the second semiconductor chip 200 in a plan view.

Figure 5A:
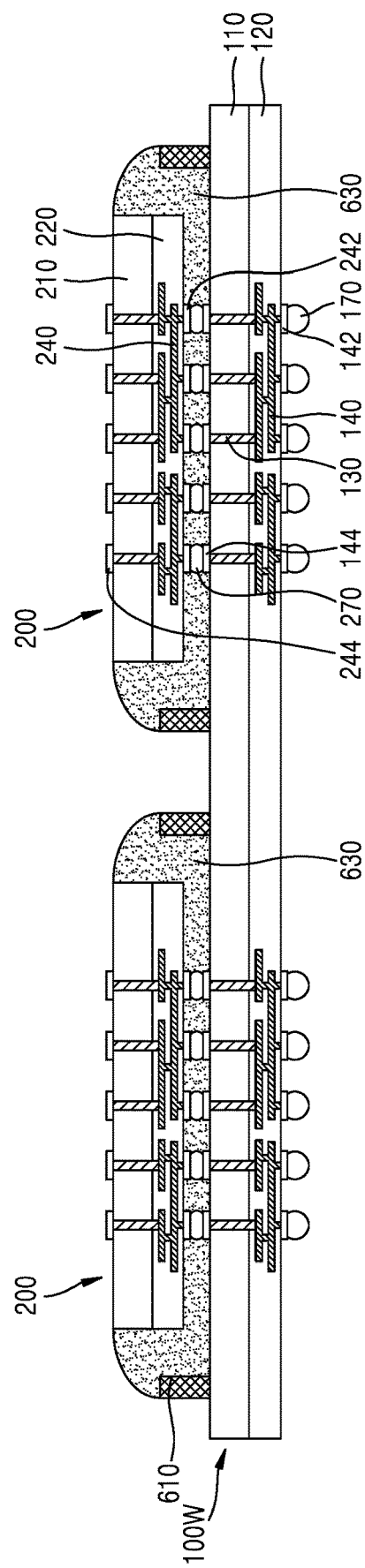
FIGS. 5A to 5C are cross-sectional views that illustrate a method of manufacturing a semiconductor package, according to exemplary embodiments of the inventive concept.
Figure 5B:
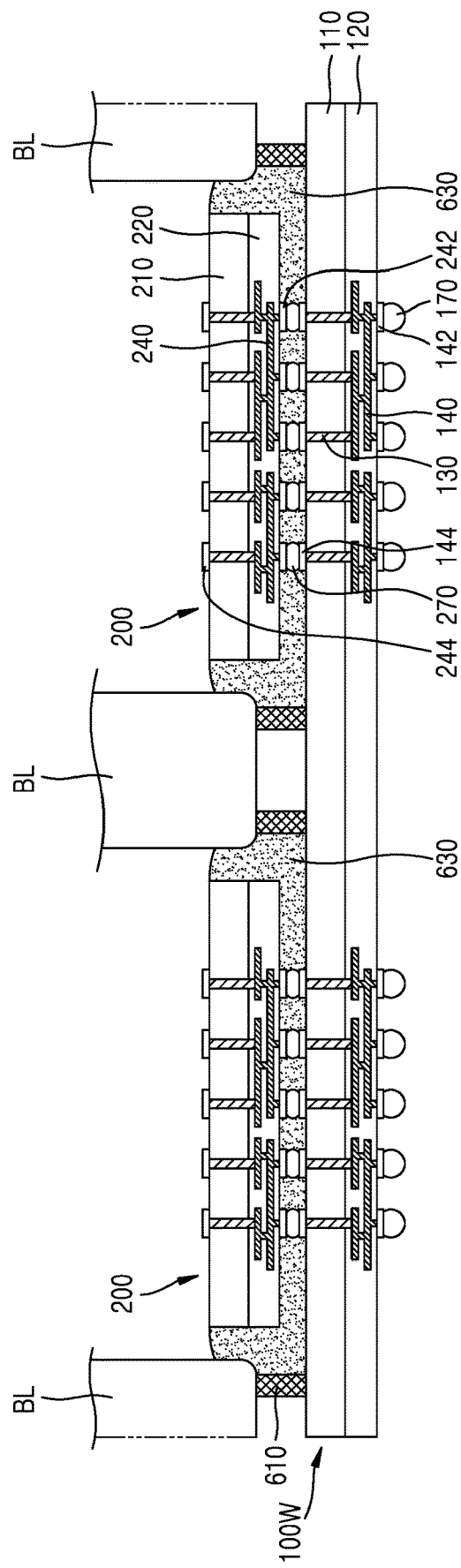
Figure 5C:
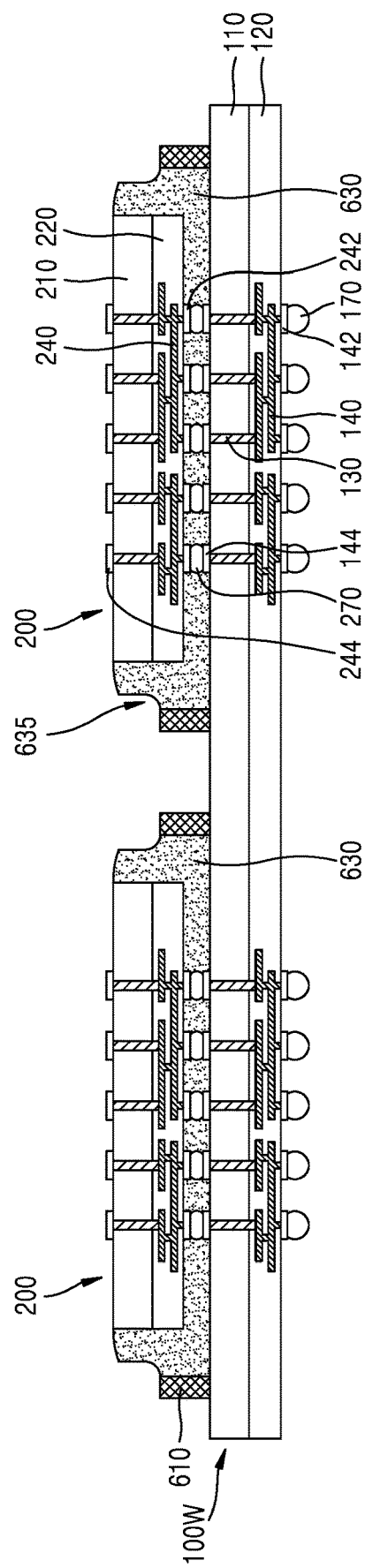

FIGS. 5A to 5C are cross-sectional views that illustrates a method of manufacturing a semiconductor package 10b, according to exemplary embodiments of the inventive concept. Hereinafter, a method of manufacturing the semiconductor package 10b described with reference to FIGS. 4A and 4B will be described with reference to FIGS. 5A to 5C.

Referring to FIG. 5A, in an embodiment, a first underfill material layer 630 fills a gap between a semiconductor wafer 100W and a second semiconductor chip 200, further extends in the lateral, horizontal, direction of the second semiconductor chip 200, and covers a first sidewall 611 and an upper surface 613 of the first dam structure 610.

More specifically, similar to those described with reference to FIGS. 2B to 2D, a structure illustrated in FIG. 5A is formed by sequentially forming a first dam structure 610 on a semiconductor wafer 100W, mounting second semiconductor chips 200 in chip mounting regions defined in the first dam structure 610, and forming a first underfill material layer 630 by applying heat and pressure to an underfill material 630F between the semiconductor wafer 100W and the second semiconductor chips 200. In some exemplary embodiments, the first underfill material layer 630 is formed to cover at least a portion of the upper surface 613 of the first dam structure 610 by appropriately adjusting the volume of the underfill material 630F.

Referring to FIG. 5B, in an embodiment, a cutting blade BL is used to remove a portion of the outer region of the first underfill material layer 630 adjacent to the first dam structure 610 and to remove a portion of the first dam structure 610. The cutting blade BL removes a portion of the first underfill material layer 630 and a portion of the first dam structure 610 while moving along edges of each second semiconductor chip 200.

Referring to FIGS. 5B and 5C, in an embodiment, as a result of the cutting process using the cutting blade BL, the upper sidewall 633 of FIG. 4B of the first underfill material layer 630 and the upper surface 613 of the first dam structure 610, which are surfaces cut by the cutting blade BL, are continuously connected. In addition, the upper sidewall 633 of the first underfill material layer 630 formed by the cutting process is formed to have a concave profile, and an indentation 635 is formed in an outer region of the first underfill material layer 630.

The semiconductor package 10b illustrated in FIGS. 4A and 4B is manufactured by sequentially stacking third to fifth semiconductor chips 300, 400, and 500 on the second semiconductor chips 200, forming a molding layer 670, and performing a dicing process thereon.

Figure 6:
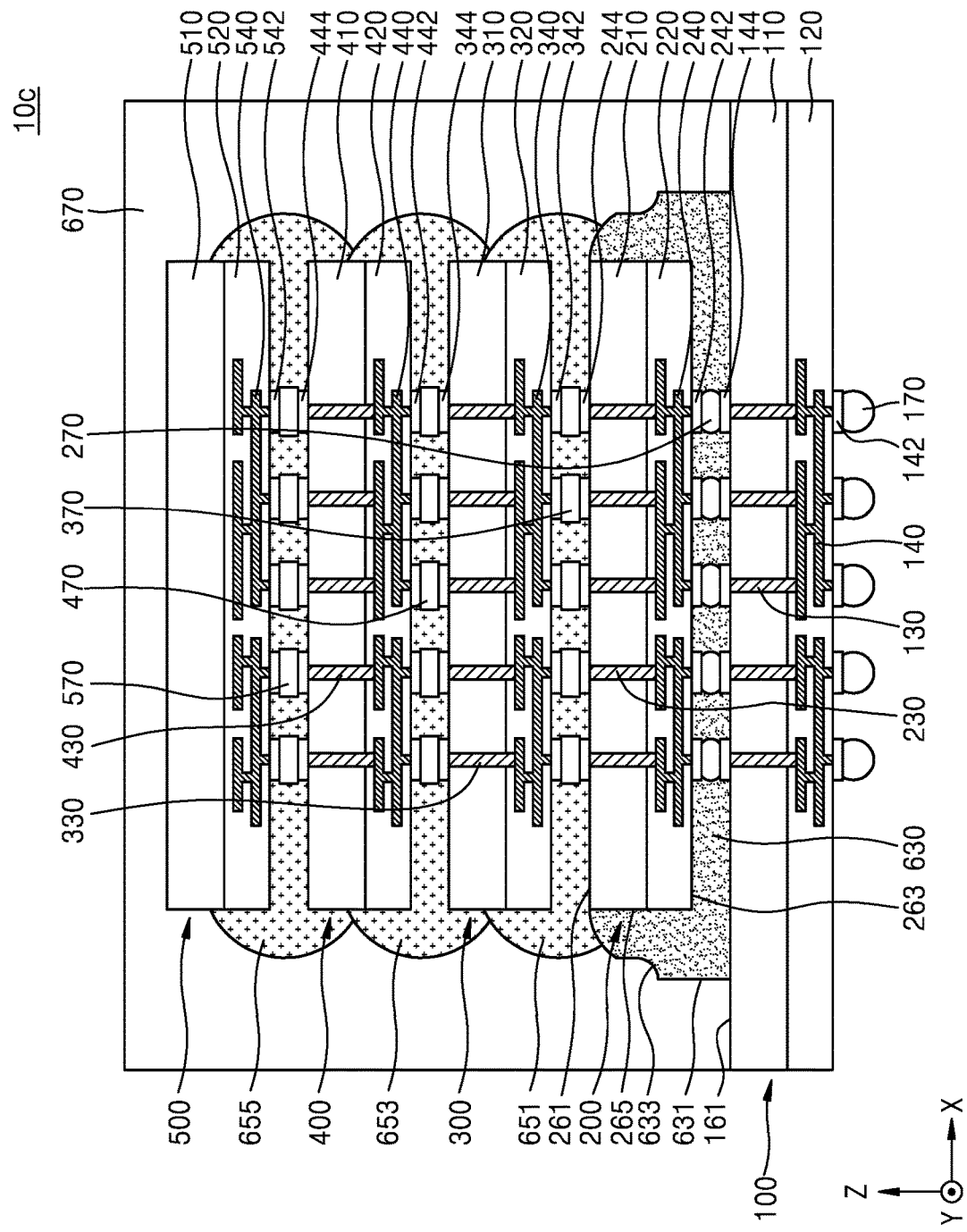
FIG. 6 is a cross-sectional view of a semiconductor package according to exemplary embodiments of the inventive concept.

FIG. 6 is a cross-sectional view of a semiconductor package 10c according to exemplary embodiments of the inventive concept. Hereinafter, the semiconductor package 10c illustrated in FIG. 6 will be described focusing on differences from the semiconductor package 10b described with reference to FIGS. 4A and 4B.

Referring to FIG. 6, in an embodiment, the semiconductor package 10c includes first to fifth semiconductor chips 100, 200, 300, 400, and 500, first to fourth underfill material layers 630, 651, 653, and 655, and a molding layer 670. The semiconductor package 10c of FIG. 6 is substantially the same as or similar to the semiconductor package 10b described with reference to FIGS. 4A and 4B, except that the semiconductor package 10c of FIG. 6 does not include the first dam structure 610 of FIG. 4A.

For example, to manufacture the semiconductor package 10c, the semiconductor package 10c illustrated in FIG. 6 is manufactured by sequentially removing the first dam structures 610 from the structure corresponding to the result of FIG. 5C, stacking the third to fifth semiconductor chips 300, 400, and 500 on the second semiconductor chips 200, forming the molding layer 670, and performing a dicing process thereon. The first dam structure 610 includes a polymer such as a photoresist material, and the first dam structure 610 is removed by a strip process after completing a thermocompression underfill process that forms the first underfill material layer 630.

In a process of manufacturing the semiconductor package 10c illustrated in FIG. 6, a lower sidewall 631 of the first underfill material layer 630 exposed by removing the first dam structure 610 includes a flat surface and is covered by the molding layer 670. The lower sidewall 631 of the first underfill material layer 630 has a profile that extends perpendicular to an upper surface 161 of the first semiconductor chip 100 and parallel to the edge of the second semiconductor chip 200 in a cross-sectional view.

Figure 7:
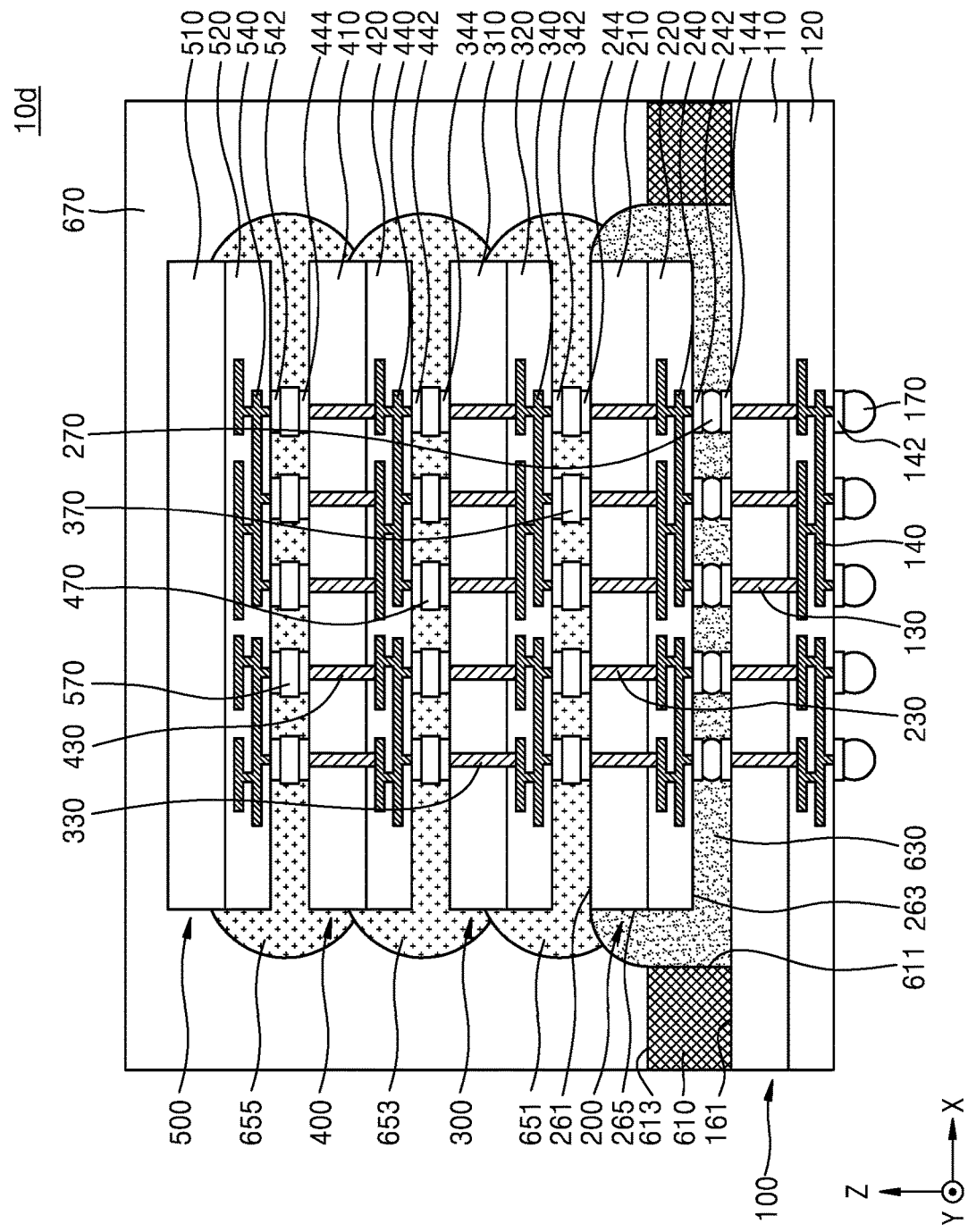
FIG. 7 is a cross-sectional view of a semiconductor package according to exemplary embodiments of the inventive concept.

FIG. 7 is a cross-sectional view of a semiconductor package 10d according to exemplary embodiments of the inventive concept. Hereinafter, the semiconductor package 10d illustrated in FIG. 7 will be described focusing on differences from the semiconductor package 10 described with reference to FIGS. 1A to 1C.

Referring to FIG. 7, in an embodiment, the semiconductor package 10d includes first to fifth semiconductor chips 100, 200, 300, 400, and 500, first to fourth underfill material layers 630, 630, 651, 653, and 655, a first dam structure 610, and a molding layer 670. The semiconductor package 10d of FIG. 7 is substantially the same as or similar to the semiconductor package 10 described with reference to FIGS. 1A to 1C, except that the first dam structure 610 extends laterally or horizontally away from the second semiconductor chip 200 so that an outer wall of the first dam structure 610 is exposed through a sidewall of the molding layer 670.

More specifically, the outer wall of the first dam structure 610 is exposed through the sidewall of the molding layer 670, and is coplanar with the sidewall of the molding layer 670. Furthermore, the outer wall of the first dam structure 610, the sidewall of the molding layer 670, and the sidewall of the first semiconductor chip 100 are coplanar with each other.

For example, to manufacture the semiconductor package 10d, the outer wall of the first dam structure 610, the sidewall of the molding layer 670, and the sidewall of the first semiconductor chip 100 are cut together along a dicing line DL by a dicing blade in a dicing process described with reference to FIG. 2G. In an embodiment, the first dam structure 610 extends from the first underfill material layer 630 to an adjacent first underfill material layer 630. The outer wall of the first dam structure 610, the sidewall of the molding layer 670, and the sidewall of the first semiconductor chip 100 are cut together in the dicing process to form a coplanar surface.

Figure 8:
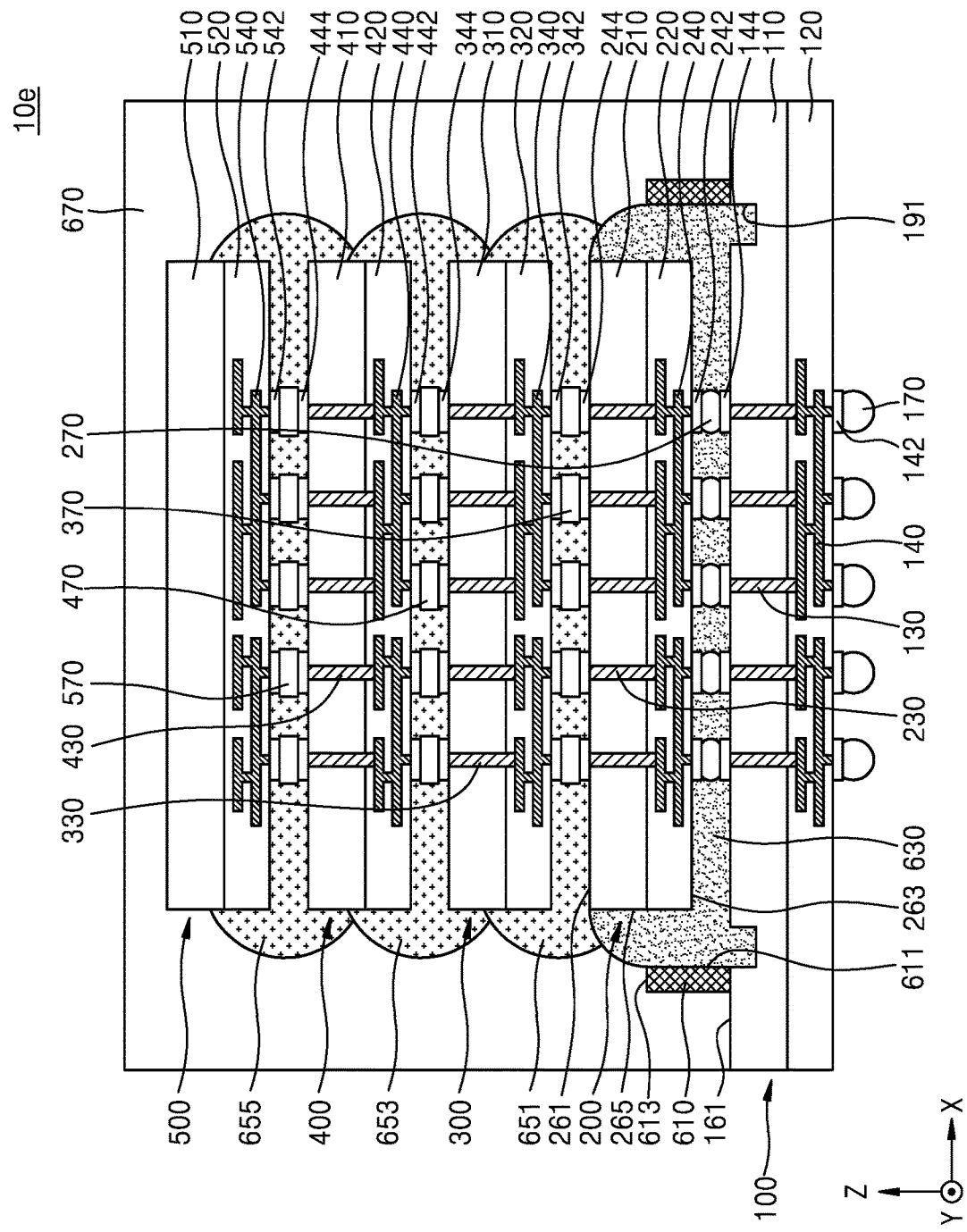
FIG. 8 is a cross-sectional view of a semiconductor package according to exemplary embodiments of the inventive concept.

FIG. 8 is a cross-sectional view of a semiconductor package 10e according to exemplary embodiments of the inventive concept. Hereinafter, the semiconductor package 10e illustrated in FIG. 8 will be described focusing on differences from the semiconductor package 10 described with reference to FIGS. 1A to 1C.

Referring to FIG. 8, in an embodiment, the semiconductor package 10e include first to fifth semiconductor chips 100, 200, 300, 400, and 500, first to fourth underfill material layers 630, 630, 651, 653, and 655, a first dam structure 610, and a molding layer 670. The semiconductor package 10e of FIG. 8 is substantially the same as or similar to the semiconductor package 10 described with reference to FIGS. 1A to 1C, except that the first semiconductor chip 100 further includes a trench 191 filled with a first underfill material layer 630.

The trench 191 of the first semiconductor chip 100 is formed on the upper side of the first semiconductor chip 100, and is formed between a first sidewall 611 of the first dam structure 610 and a sidewall 265 of the second semiconductor chip 200. In a process of forming the first underfill material layer 630, an underfill material that constitutes the first underfill material layer 630 fills the trench 191 of the first semiconductor chip 100 adjacent to the first dam structure 610.

In exemplary embodiments, the trench 191 has a ring shape that continuously extends to surround edges of the second semiconductor chip 200 in a plan view. In other exemplary embodiments, the first semiconductor chip 100 includes a plurality of trenches 191 laterally or horizontally spaced apart from each other along the edge of the second semiconductor chip 200.

Figure 9:
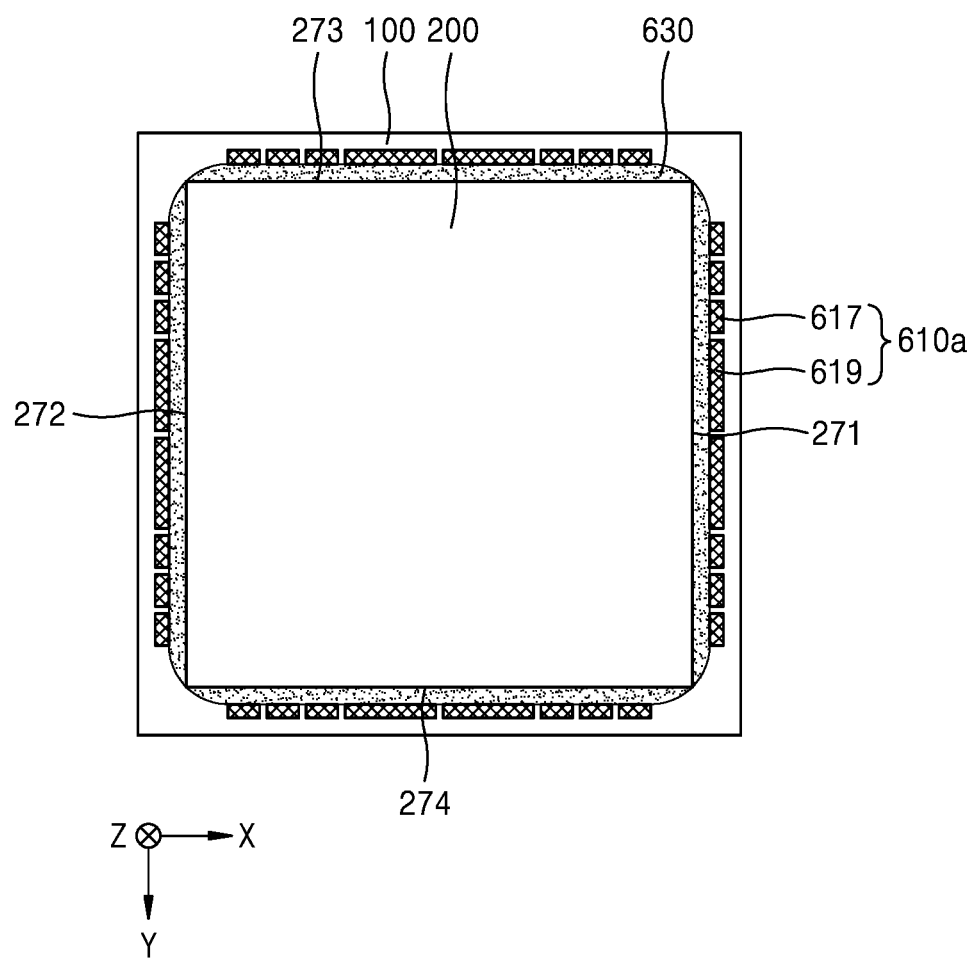
FIG. 9 is a plan view of a semiconductor package according to exemplary embodiments of the inventive concept.

FIG. 9 is a plan view of a semiconductor package according to exemplary embodiments of the inventive concept. FIG. 9 illustrates a first semiconductor chip 100, a second semiconductor chip 200, a first underfill material layer 630, and a first dam structure 610a that are included in the semiconductor package. Hereinafter, the semiconductor package illustrated in FIG. 9 will be described focusing on differences from the semiconductor package 10 described with reference to FIGS. 1A to 1C.

Referring to FIG. 9, in an embodiment, the first dam structure 610a includes a first unit dam structure 617 having a first horizontal length and a second unit dam structure 619 having a second horizontal length that differs from the first horizontal length. The first unit dam structure 617 has a first horizontal length in a direction parallel to the edge of the second semiconductor chip 200 that faces the first unit dam structure 617, and the second unit dam structure 619 has a second horizontal length greater than the first horizontal length in a direction parallel to the edge of the second semiconductor chip 200 that faces the second unit dam structure 617. For example, the second unit dam structure 619 is longer than the first unit dam structure 617, and the first unit dam structure 617 is shorter than the second unit dam structure 619.

For example, the first dam structure 610a includes a combination of at least one first unit dam structure 617 and at least one second unit dam structure 619. In exemplary embodiments, the longer second unit dam structure 619 is arranged in the center region of the edge of the second semiconductor chip 200, and the shorter first unit dam structure 617 is arranged in a region adjacent to a corner of the second semiconductor chip 200, where two edges of the second semiconductor chip meet.

Because the longer second unit dam structure 619 is arranged in the center region of the edge of the second semiconductor chip 200, the first dam structure 610a effectively prevents the flow of the highly fluidic underfill material around the center of the edge of the second semiconductor chip 200 in a process of forming the first underfill material layer 630.

Figure 10A:
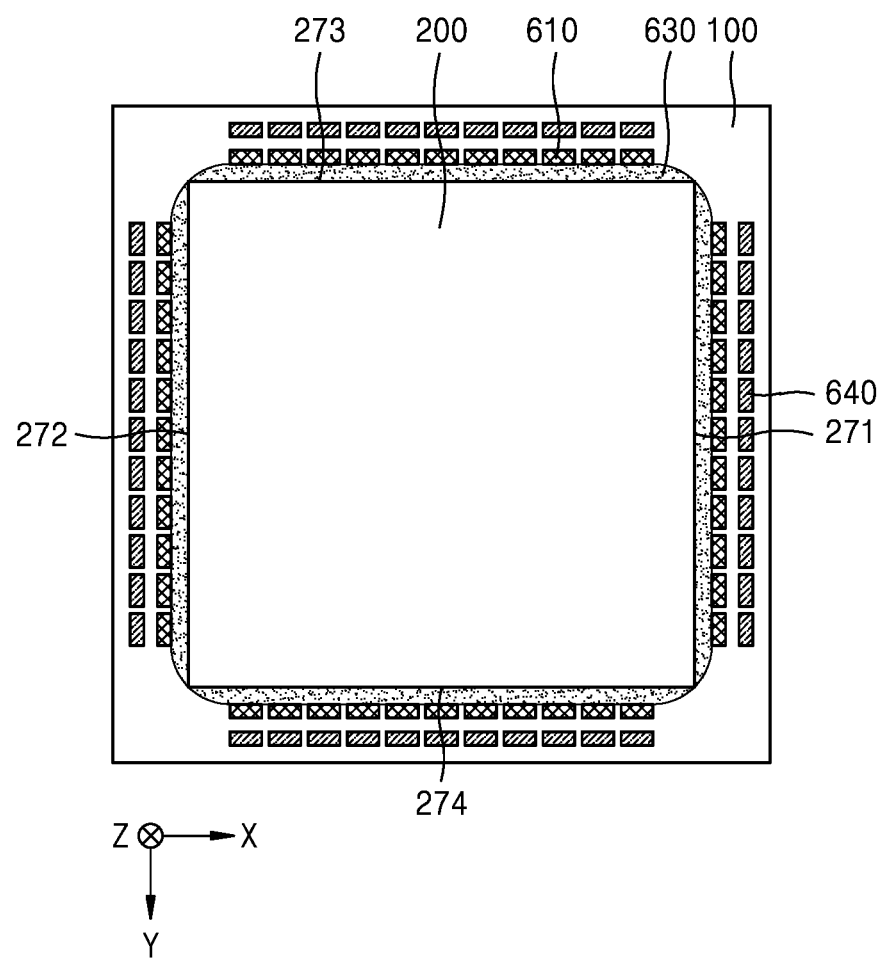
FIGS. 10A and 10B are plan views of semiconductor packages according to exemplary embodiments of the inventive concept.
Figure 10B:
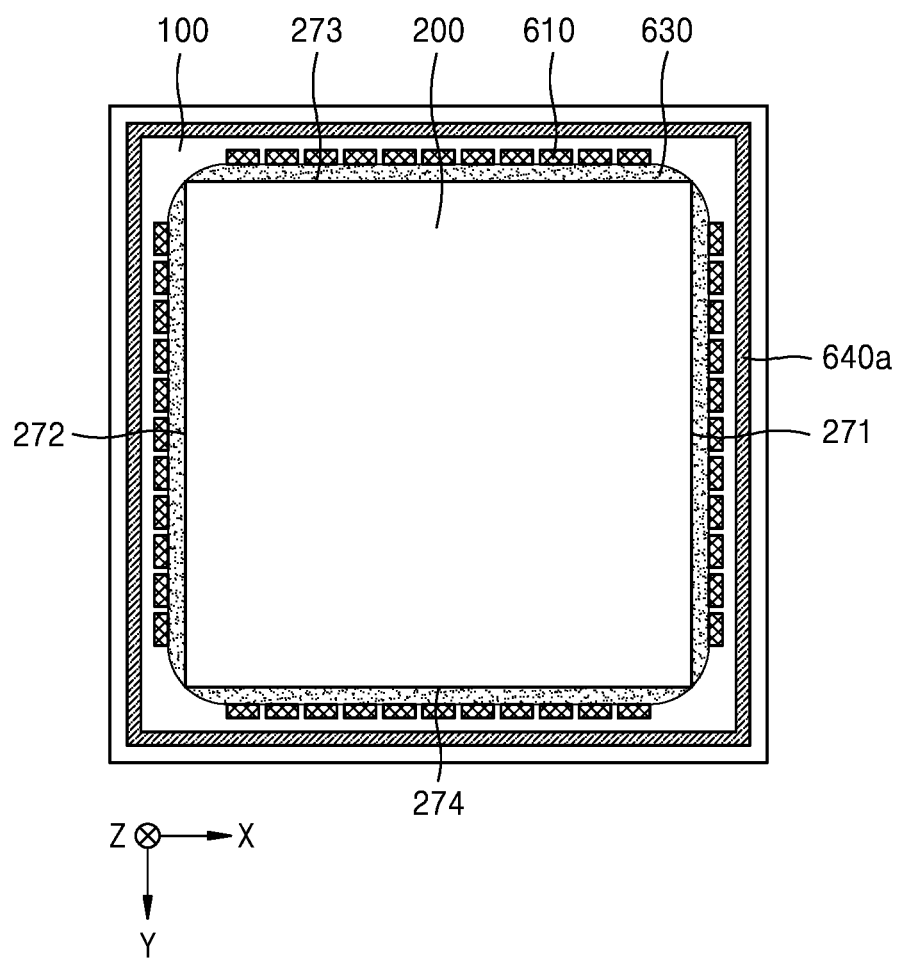

FIGS. 10A and 10B are plan views of semiconductor packages according to exemplary embodiments of the inventive concept; and FIGS. 10A and 10B illustrate a first semiconductor chip 100, a second semiconductor chip 200, a first underfill material layer 630, a first dam structure 610, and a second dam structure 640 (640a) that are included in the semiconductor package. Hereinafter, the semiconductor packages illustrated in FIGS. 10A and 10B will be described focusing on differences from the semiconductor package 10 described with reference to FIGS. 1A to 1C.

Referring to FIG. 10A, in an embodiment, the second dam structure 640 is disposed on the first semiconductor chip 100, and is spaced apart from the edge of the second semiconductor chip 200 with the first dam structure 610 therebetween. For example, when the first dam structure 610 is spaced apart from the edge of the second semiconductor chip 200 by a first horizontal distance, the second dam structure 640 is spaced apart from the edge of the second semiconductor chip 200 by a second horizontal distance that is greater than the first horizontal distance.

The second dam structure 640 includes a plurality of bar-shaped or line-shaped unit dam structures that extend linearly along the edge of the second semiconductor chip 200 in a plan view. The plurality of unit dam structures are spaced apart from each other with the slits therebetween. The unit dam structures of the second dam structure 640 are arranged along an imaginary line that surrounds the second semiconductor chip 200 in a plan view. The second dam structure 640 prevents an underfill material that has overflowed the first dam structure 610 from flowing to the edge of the first semiconductor chip 100 in a process of forming the first underfill material layer 630.

Referring to FIG. 10B, in an embodiment, the second dam structure 640a is disposed on the first semiconductor chip 100, is laterally or horizontally spaced apart from edges of the second semiconductor chip 200 with the first dam structure 610 therebetween, and has an integral ring shape that surrounds the edges of the second semiconductor chip 200 in a plan view. The second dam structure 640a prevents an underfill material that has overflowed the first dam structure 610 from flowing to the edge of the first semiconductor chip 100 in a process of forming the first underfill material layer 630. Because most of the flow of the underfill material is blocked by the first dam structure 610, even when the second dam structure 640a has an integral ring shape, damage to the second dam structure 640a due to the stress applied upon shrinkage of the underfill material is minimized.

Figure 11:
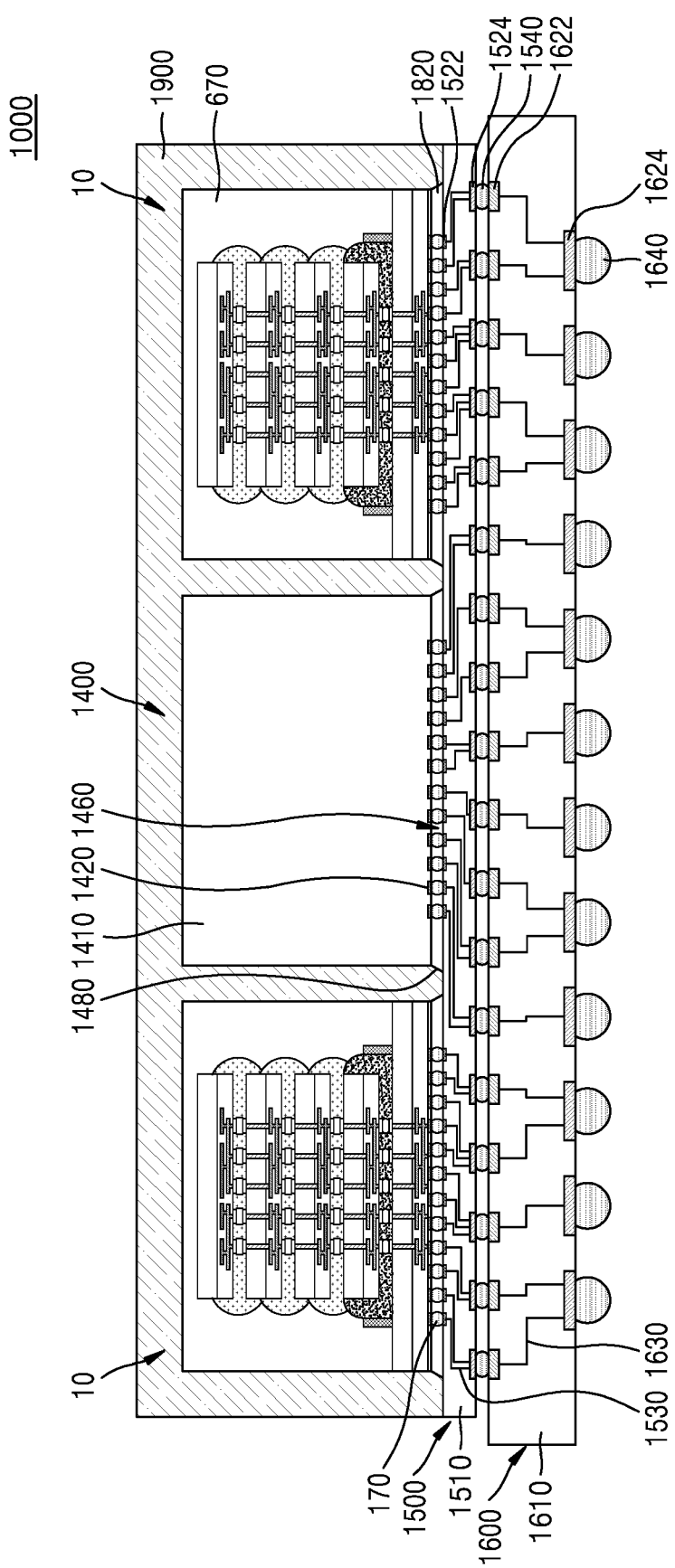
FIG. 11 is a cross-sectional view of a semiconductor package according to exemplary embodiments of the inventive concept.

FIG. 11 is a cross-sectional view of a semiconductor package 1000 according to exemplary embodiments of the inventive concept.

Referring to FIG. 11, in an embodiment, the semiconductor package 1000 includes a main board 1600 on which an interposer 1500 is mounted, at least one sub-semiconductor package 10 bonded to the interposer 1500, and a semiconductor chip 1400. FIG. 11 shows an exemplary sub-semiconductor package 10 that corresponds to the semiconductor package 10 described with reference to FIGS. 1A to 1C. However, embodiments are not limited thereto, and the sub-semiconductor package may be the semiconductor package 10a described with reference to FIGS. 3A and 3B, the semiconductor package 10b described with reference to FIGS. 4A and 4B, the semiconductor packages 10c, 10d, and 10e described with reference to FIGS. 6 to 8, or the semiconductor packages described with reference to FIGS. 9, 10A, and 10B. Hereinafter, the sub-semiconductor package 10 will be described together with reference to FIGS. 1A to 1C. In addition, the semiconductor package 1000 may be referred to as a system.

The sub-semiconductor package 10 is bonded to the interposer 1500 through a plurality of first connection bumps 170. The first connection bumps 170 provide, to the sub-semiconductor package 10, at least one of a signal, power, and ground for the sub-semiconductor package 10.

Although FIG. 11 illustrates that the semiconductor package 1000 includes two sub-semiconductor packages 10, embodiments of the inventive concept are not limited thereto. For example, in other embodiments, the semiconductor package 1000 includes one sub-semiconductor package 10 or three or more sub-semiconductor packages 10.

The semiconductor chip 1400 includes a semiconductor substrate 1410 in which a semiconductor device is formed on an active surface, and a plurality of connection pads 1420. In exemplary embodiments, the connection pads 1420 each include at least one of aluminum, copper, or nickel. The semiconductor chip 1400 is bonded to the interposer 1500 through a plurality of connection bumps 1460. The connection bumps 1460 are bonded to the connection pads 1420. The semiconductor chip 1400 may be, for example, a central processing unit (CPU) chip, a graphics processing unit (GPU) chip, or an application processor (AP) chip, but embodiments are not limited thereto. Because the semiconductor substrate 1410 is a component substantially similar to the first semiconductor substrate 110 illustrated in FIG. 1A and the connection bump 1460 is a component similar to the first connection bump 170, to the extent that a detailed description of these elements is omitted, it may be assumed that the descriptions of these elements are at least similar to the corresponding description of the corresponding elements.

The interposer 1500 includes a base layer 1510, a plurality of first upper surface pads 1522 and a plurality of first lower surface pads 1524 respectively disposed on an upper surface and a lower surface of the base layer 1510, and a plurality of first wiring paths 1530 that electrically connect the first upper surface pads 1522 to the first lower surface pads 1524 through the base layer 1510. The base layer 1510 may include a semiconductor, glass, ceramic, or plastic. For example, the base layer 1510 includes silicon. The first wiring paths 1530 are connected to the first upper surface pads 1522 and/or the first lower surface pads 1524 on the upper surface and/or the lower surface of the base layer 1510, and/or internal through electrodes in the base layer 1510 that electrically connect the first upper surface pads 1522 to the first lower surface pads 1524. The first connection bumps 170 that electrically connect the sub-semiconductor package 10 to the interposer 1500 and the connection bumps 1460 that electrically connect the semiconductor chip 1400 to the interposer 1500 are connected to the first upper surface pads 1522.

A first underfill layer 1820 is interposed between the sub-semiconductor package 10 and the interposer 1500, and a second underfill layer 1480 is interposed between the semiconductor chip 1400 and the interposer 1500. The first underfill layer 1820 surrounds the first connection bump 170, and the second underfill layer 1480 surrounds the connection bump 1460.

The semiconductor package 1000 furthers include a package molding layer 1900 that surrounds sidewalls of the sub-semiconductor package 10 and the semiconductor chip 1400 on the interposer 1500. The package molding layer 1900 includes, for example, an EMC. In exemplary embodiments, the package molding layer 1900 covers upper surfaces of the sub-semiconductor package 10 and the semiconductor chip 1400. In other exemplary embodiments, the package molding layer 1900 does not cover the upper surfaces of the sub-semiconductor package 10 and the semiconductor chip 1400. In other exemplary embodiments, a heat dissipation member is bonded onto the sub-semiconductor package 10 and the semiconductor chip 1400 with a thermal interface material (TIM) therebetween.

A plurality of board connection terminals 1540 are bonded on the first lower surface pads 1524. The board connection terminals 1540 electrically connect the interposer 1500 to the main board 1600.

The main board 1600 includes a base board layer 1610, a plurality of second upper surface pads 1622 and a plurality of second lower surface pads 1624 respectively disposed on an upper surface and a lower surface of the base board layer 1610, and a plurality of second wiring paths 1630 that electrically connect the second upper surface pads 1622 to the second lower surface pads 1624 through the base board layer 1610.

In exemplary embodiments, the main board 1600 is a printed circuit board. For example, the main board 1600 is a multi-layer printed circuit board. The base board layer 1610 includes at least one of a phenol resin, an epoxy resin, or a polyimide.

Solder resist layers that expose the second upper surface pads 1622 and the second lower surface pads 1624 are formed on the upper and lower surfaces of the base board layer 1610, respectively. The board connection terminals 1540 are connected to the second upper surface pads 1622, and a plurality of external connection terminals 1640 are connected to the second lower surface pads 1624. The board connection terminals 1540 electrically connect the first lower surface pads 1524 to the second upper surface pads 1622. The external connection terminals 1640 connect the semiconductor package 1000 to the outside.

In other exemplary embodiments, the semiconductor package 1000 does not include the main board 1600, and the board connection terminals 1540 of the interposer 1500 function as the external connection terminals 1640.

While the inventive concept has been particularly shown and described with reference to embodiments thereof, it will be understood that various changes in form and details may be made therein without departing from the spirit and scope of the following claims.

What is claimed is:

1. A semiconductor package, comprising:
   a first semiconductor chip;
   a second semiconductor chip stacked on the first semiconductor chip;
   an underfill material layer interposed between the first semiconductor chip and the second semiconductor chip; and
   a first dam structure disposed on the first semiconductor chip, wherein the first dam structure extends along an edge of the second semiconductor chip and includes unit dam structures spaced apart from each other with a slit therebetween,
   wherein a vertical level of an upper surface of the first dam structure is located between a vertical level of a lower surface of the second semiconductor chip and a vertical level of an upper surface of the second semiconductor chip,
   the unit dam structures of the first dam structure each have a rectangular shape in a plan view, and
   a first sidewall of the first dam structure is in contact with the underfill material layer and includes a flat vertical surface parallel to a sidewall of the second semiconductor chip that faces the first sidewall of the first dam structure.

2. The semiconductor package of claim 1, wherein
   an interval between the unit dam structures of the first dam structure is about 100% or less of a horizontal length of each of the unit dam structures of the first dam structure, wherein the horizontal length is measured parallel to the sidewall of the second semiconductor chip.

3. The semiconductor package of claim 2, wherein
   the horizontal length of each of the unit dam structures of the first dam structure is between about 30 μm and about 150 μm.

4. The semiconductor package of claim 1, wherein
   the first dam structure includes a metal.

5. The semiconductor package of claim 1, wherein
   the first dam structure includes a polymer.

6. The semiconductor package of claim 1, wherein
   the underfill material layer comprises:
   a linear sidewall in contact with the first sidewall of the first dam structure, wherein the linear sidewall extends in a direction perpendicular to an upper surface of the first semiconductor chip; and
   a curvilinear sidewall connected to the linear sidewall,
   wherein the curvilinear sidewall defines an indentation that extends along the edge of the second semiconductor chip.

7. The semiconductor package of claim 6, wherein
   the upper surface of the first dam structure is continuously connected to the curvilinear sidewall of the underfill material layer.

8. The semiconductor package of claim 1, further comprising
   a molding layer disposed on the first semiconductor chip, wherein the molding layer surrounds the second semiconductor chip in a plan view.

9. The semiconductor package of claim 8, wherein
   the first dam structure is exposed through a sidewall of the molding layer.

10. The semiconductor package of claim 1, wherein
    the first semiconductor chip comprises a trench that is filled with the underfill material layer, and
    the trench of the first semiconductor chip is located between the first sidewall of the first dam structure and the edge of the second semiconductor chip.

11. The semiconductor package of claim 1, wherein
    the first dam structure comprises:
    a first unit dam structure that has a first horizontal length in a direction parallel to the edge of the second semiconductor chip; and
    a second unit dam structure having a second horizontal length greater than the first horizontal length in a direction parallel to the edge of the second semiconductor chip.

12. The semiconductor package of claim 1, further comprising
    a second dam structure disposed on the first semiconductor chip and spaced apart from the edge of the second semiconductor chip with the first dam structure therebetween.

13. The semiconductor package of claim 1, further comprising
    a plurality of semiconductor chips that are vertically stacked on the second semiconductor chip.

14. A semiconductor package, comprising:
    a first semiconductor chip that includes a first semiconductor substrate, a first semiconductor device layer disposed on the first substrate and that includes a first interconnect structure, and a first through electrode that penetrates through the first semiconductor substrate and is electrically connected to the first interconnect structure;
    a second semiconductor chip disposed on the first semiconductor chip, wherein the second semiconductor chip includes a second semiconductor substrate, a second semiconductor device layer disposed on the second substrate and that includes a second interconnect structure, and a second through electrode that penetrates through the second semiconductor substrate and is electrically connected to the second interconnect structure;
    a connection bump interposed between the first semiconductor chip and the second semiconductor chip;
    an underfill material layer interposed between the first semiconductor chip and the second semiconductor chip, wherein the underfill material layer surrounds a sidewall of the connection bump and covers at least a portion of a sidewall of the second semiconductor chip;
    a first dam structure disposed on the first semiconductor chip, wherein the first dam structure contacts the underfill material layer, extends along an edge of the second semiconductor chip and includes a plurality of slits and a plurality of unit dam structures spaced apart from each other by the plurality of slits; and
    a molding layer disposed on the first semiconductor chip and that covers the underfill material layer and the first dam structure,
    wherein the first dam structure further includes:
    a first sidewall in contact with the underfill material layer and that includes a flat vertical surface parallel to the sidewall of the second semiconductor chip; and
    an upper surface located between a vertical level of a lower surface of the second semiconductor chip and a vertical level of an upper surface of the second semiconductor chip, and an interval between unit dam structures in a first direction parallel to the edge of the second semiconductor chip is about 100% or less of a horizontal length of each of the plurality of unit dam structures in the first direction.

* * * * *